(12) United States Patent
Oh et al.

(10) Patent No.: US 11,961,552 B2
(45) Date of Patent: Apr. 16, 2024

(54) MEMORY DEVICE INCLUDING PARTIAL PAGES IN MEMORY BLOCKS

(71) Applicant: SK hynix Inc., Icheon-si (KR)

(72) Inventors: Sung Lae Oh, Icheon-si (KR); Jin Ho Kim, Icheon-si (KR); Sang Hyun Sung, Icheon-si (KR); Hyun Soo Shin, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 146 days.

(21) Appl. No.: 17/703,855

(22) Filed: Mar. 24, 2022

(65) Prior Publication Data

US 2023/0111844 A1 Apr. 13, 2023

(30) Foreign Application Priority Data

Oct. 13, 2021 (KR) .......................... 10-2021-0135653

(51) Int. Cl.
  *G11C 5/06* (2006.01)
  *G11C 11/408* (2006.01)
  *G11C 11/4094* (2006.01)
  *G11C 11/4096* (2006.01)

(52) U.S. Cl.
  CPC .......... *G11C 11/4096* (2013.01); *G11C 5/06* (2013.01); *G11C 11/4085* (2013.01); *G11C 11/4094* (2013.01)

(58) Field of Classification Search
  CPC ... G11C 11/4096; G11C 5/06; G11C 11/4085; G11C 11/4094; G11C 5/025; G11C 5/04; G11C 11/408; G11C 11/415; G11C 11/418; G11C 16/08; G11C 11/4087; G11C 5/063; G11C 7/18; G11C 8/14; G11C 5/0401
  See application file for complete search history.

(56) References Cited

U.S. PATENT DOCUMENTS

2021/0327509 A1* 10/2021 Jung .................. G11C 16/0483
2022/0277792 A1* 9/2022 Yun ........................ H10B 43/50
2023/0056107 A1* 2/2023 Yamada ............. G11C 16/3459

FOREIGN PATENT DOCUMENTS

| KR | 10-2016-0131458 A | 11/2016 |
| KR | 10-2017-0042450 A | 4/2017 |
| KR | 10-2021-0110995 A | 9/2021 |
| KR | 10-2021-0147687 A | 12/2021 |

* cited by examiner

*Primary Examiner* — Xiaochun L Chen

(57) ABSTRACT

A memory device includes a plurality of bit lines extending in a first direction and arranged in a second direction; and a cell region including a plane which is coupled to the plurality of bit lines, wherein the plane is divided into a plurality of memory groups each including a plurality of partial pages to be disposed in a plurality of rows in the first direction.

19 Claims, 19 Drawing Sheets

MEMORY DEVICE INCLUDING PARTIAL PAGES IN MEMORY BLOCKS

CROSS-REFERENCE TO RELATED APPLICATION

The present application claims priority under 35 U.S.C. § 119(a) to Korean Patent Application No. 10-2021-0135653 filed in the Korean Intellectual Property Office on Oct. 13, 2021, which is incorporated herein by reference in its entirety.

BACKGROUND

1. Technical Field

Various embodiments generally relate to a semiconductor technology, and more particularly, to a memory device.

2. Related Art

A net die refers to the number of chips fabricated on a single wafer, and it is necessary to increase a net die in order to increase productivity and secure price competitiveness.

In order to increase a net die, it is most effective to increase the diameter of a wafer. However, this requires a lot of investment cost, and in addition, the development of equipment for handling a large-sized wafer should be conducted in parallel. Since it takes a lot of time to develop the equipment and the equipment is expensive, it is not easy to apply the large-sized wafer to actual mass production.

Scaling down the line width of a circuit makes it possible to reduce a chip size and increase a net die. However, it becomes gradually more difficult to increase a net die through scaling down due to limitations in miniaturization technology.

SUMMARY

Various embodiments are directed to providing a memory device capable of increasing a net die.

In an embodiment, a memory device may include: a plurality of bit lines extending in a first direction and arranged in a second direction; and a cell region that includes a plane and that is coupled to the plurality of bit lines, wherein the plane is divided into a plurality of memory groups each including a plurality of partial pages, that are disposed in a plurality of rows arranged in the first direction.

In an embodiment, a memory device may include: a plurality of bit lines extending in a first direction and arranged in a second direction; and a cell region including a plurality of memory blocks that are coupled to the plurality of bit lines, wherein each memory block is divided into a plurality of sub-blocks each including a plurality of partial pages that are disposed in a plurality of rows arranged in the first direction.

In an embodiment, a memory device may include: a cell region included in a first wafer, and including a plurality of memory blocks, which are coupled to a plurality of bit lines that extend in a first direction and that are arranged in a second direction; a pass transistor circuit, included in the first wafer, that is configured to transfer an operating voltage to the plurality of memory blocks in response to a block selection signal; and a block switch circuit included in a second wafer, which overlaps with the first wafer in a vertical direction, that is configured to provide the block selection signal to the pass transistor circuit, wherein each memory block is divided into a plurality of sub-blocks each including a plurality of partial pages that are disposed in a plurality of rows arranged in the first direction.

DETAILED DESCRIPTION

Figure 1:
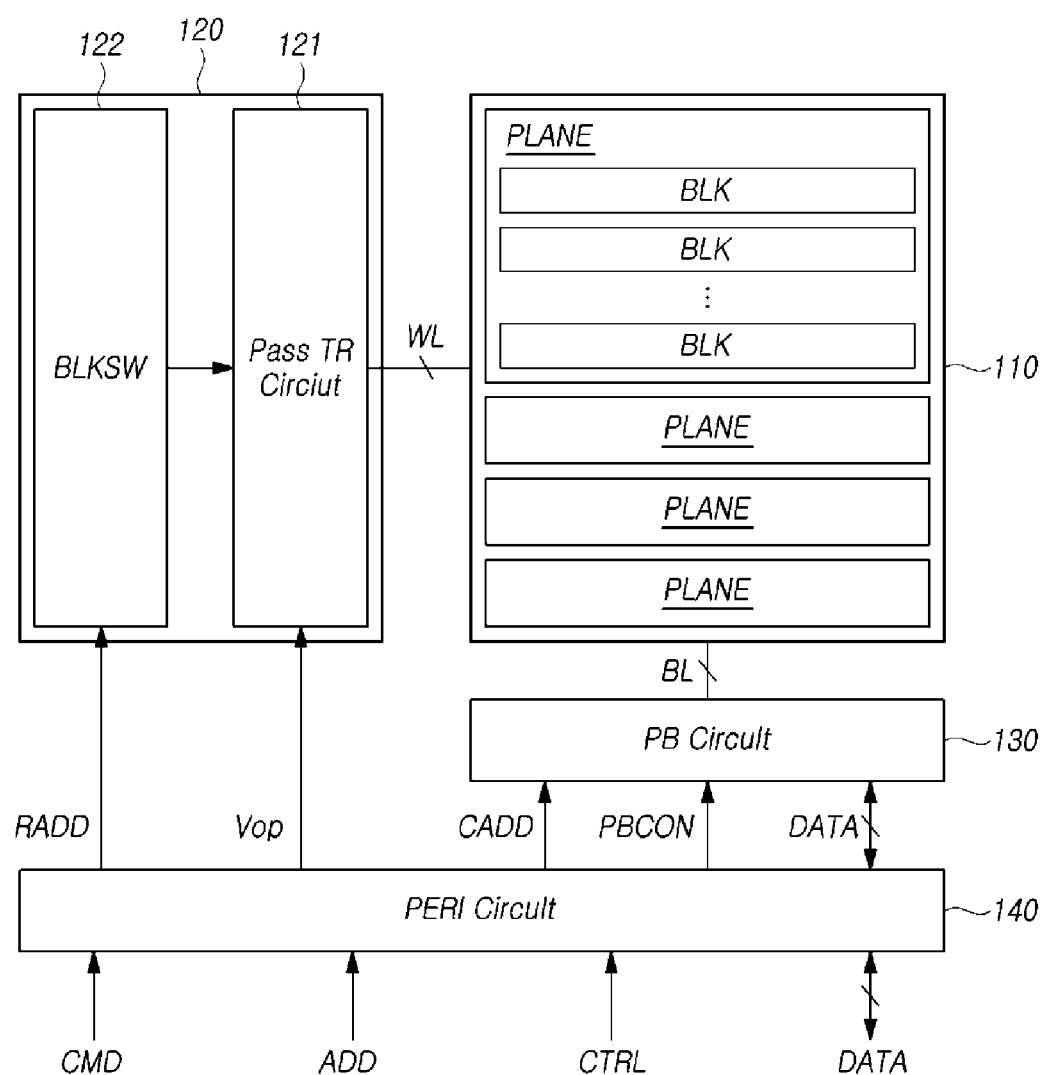
FIG. 1 is a block diagram of a memory device in accordance with an embodiment of the present disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the"), the article may include a plural of that noun unless specifically stated otherwise. In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element B" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

FIG. 1 is a block diagram of a memory device in accordance with an embodiment of the present disclosure.

Referring to FIG. 1, a memory device 100 in accordance with an embodiment of the present disclosure may include a cell region 110, a row decoder 120, a page buffer circuit (PB Circuit) 130 and a peripheral circuit (PERI Circuit) 140.

The cell region 110 may be coupled to the row decoder 120 through a plurality of word lines WL, and may be coupled to the page buffer circuit 130 through a plurality of bit lines BL.

The cell region 110 may include a plurality of planes PLANE. Each plane PLANE may include a plurality of memory blocks BLK. Although not illustrated, each memory block BLK may include a plurality of pages. The memory block BLK may be a basic unit of an erase operation, and the page may be a basic unit of a read operation.

Although not illustrated, the cell region 110 may include a plurality of memory cells that are disposed in regions where the plurality of bit lines BL and the plurality of word lines WL intersect. The memory cell may be a volatile memory cell, which loses data stored therein when power supply is cut off, or may be a nonvolatile memory cell, which retains data stored therein even when power supply is cut off. For example, when the memory cell is a volatile memory cell, the memory device 100 may be a DRAM (dynamic random access memory), an SRAM (static random access memory), a mobile DRAM, a DDR SDRAM (double data rate synchronous dynamic random access memory), an LPDDR (low power DDR) SDRAM, a GDDR (graphic DDR) SDRAM or an RDRAM (Rambus dynamic random access memory). When the memory cell is a nonvolatile memory cell, the memory device 100 may be an EEPROM (electrically erasable programmable read-only memory), a flash memory, a PRAM (phase change random access memory), an RRAM (resistive random access memory), an NFGM (nano-floating gate memory), a PoRAM (polymer random access memory), an MRAM (magnetic random access memory) or an FRAM (ferroelectric random access memory). The memory device 100 may be a hybrid memory that includes both volatile memory cells and nonvolatile memory cells.

The memory cell may be a single level cell (SLC) that stores one-bit data or a multi-level cell (MLC), which stores two or more-bit data. The multi-level cell may store two-bit data, three-bit data, four-bit data, and so forth. The cell region 110 may include at least one of single level cells and multi-level cells.

The row decoder 120 may include a pass transistor circuit (Pass TR Circuit) 121 and a block switch circuit (BLKSW) 122.

The pass transistor circuit 121 may be coupled to the cell region 110 through the plurality of word lines WL. One memory block BLK may be selected in response to a block selection signal from the block switch circuit 122, and the pass transistor circuit 121 may transfer an operating voltage Vop from the peripheral circuit 140, to the word lines WL of the selected memory block BLK.

The block switch circuit 122 may generate the block selection signal in response to a row address signal RADD from the peripheral circuit 140, and may provide the block selection signal to the pass transistor circuit 121 through a block word line.

The page buffer circuit 130 may be coupled to the cell region 110 through the plurality of bit lines BL. The page buffer circuit 130 may receive a page buffer control signal PBCON from the peripheral circuit 140, and may transmit and receive a data signal DATA to and from the peripheral circuit 140.

The page buffer circuit 130 may control the bit lines BL in response to the page buffer control signals PBCON. For example, the page buffer circuit 130 may detect data, stored in a memory cell of the cell region 110, by sensing the signal of a bit line BL in response to the page buffer control signal PBCON, and may transmit the data signal DATA to the peripheral circuit 140 depending on the detected data. The page buffer circuit 130 may apply a signal to a bit line BL on the basis of the data signal DATA received from the peripheral circuit 140 in response to the page buffer control signal PBCON, and accordingly, may write data to a memory cell of the cell region 110. The page buffer circuit 130 may write data to or read data from a memory cell that is coupled to a word line activated by the row decoder 120.

The peripheral circuit 140 may receive a command signal CMD, an address signal ADD and a control signal CTRL from a device outside the memory device 100, for example, a memory controller, and may transmit and receive data DATA to and from the device outside the memory device 100. The peripheral circuit 140 may output signals for writing data to the cell region 110 or reading data from the cell region 110, for example, the row address signal RADD, a column address signal CADD, the page buffer control signal PBCON and so forth, on the basis of the command signal CMD, the address signal ADD and the control signal CTRL. The peripheral circuit 140 may generate various voltages, including the operating voltage Vop, which are required in the memory device 100. For example, the peripheral circuit 140 may generate program voltages, pass voltages, read voltages and erase voltages of various levels.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may be the extending direction of bit lines and the arrangement direction of word lines, and the second direction SD may be the extending direction of the word lines and the arrangement direction of the bit lines. The first direction FD and the second direction SD may substantially perpendicularly intersect with each other. In the drawings, a direction indicated by an arrow and a direction opposite thereto indicate the same direction.

Figure 2:
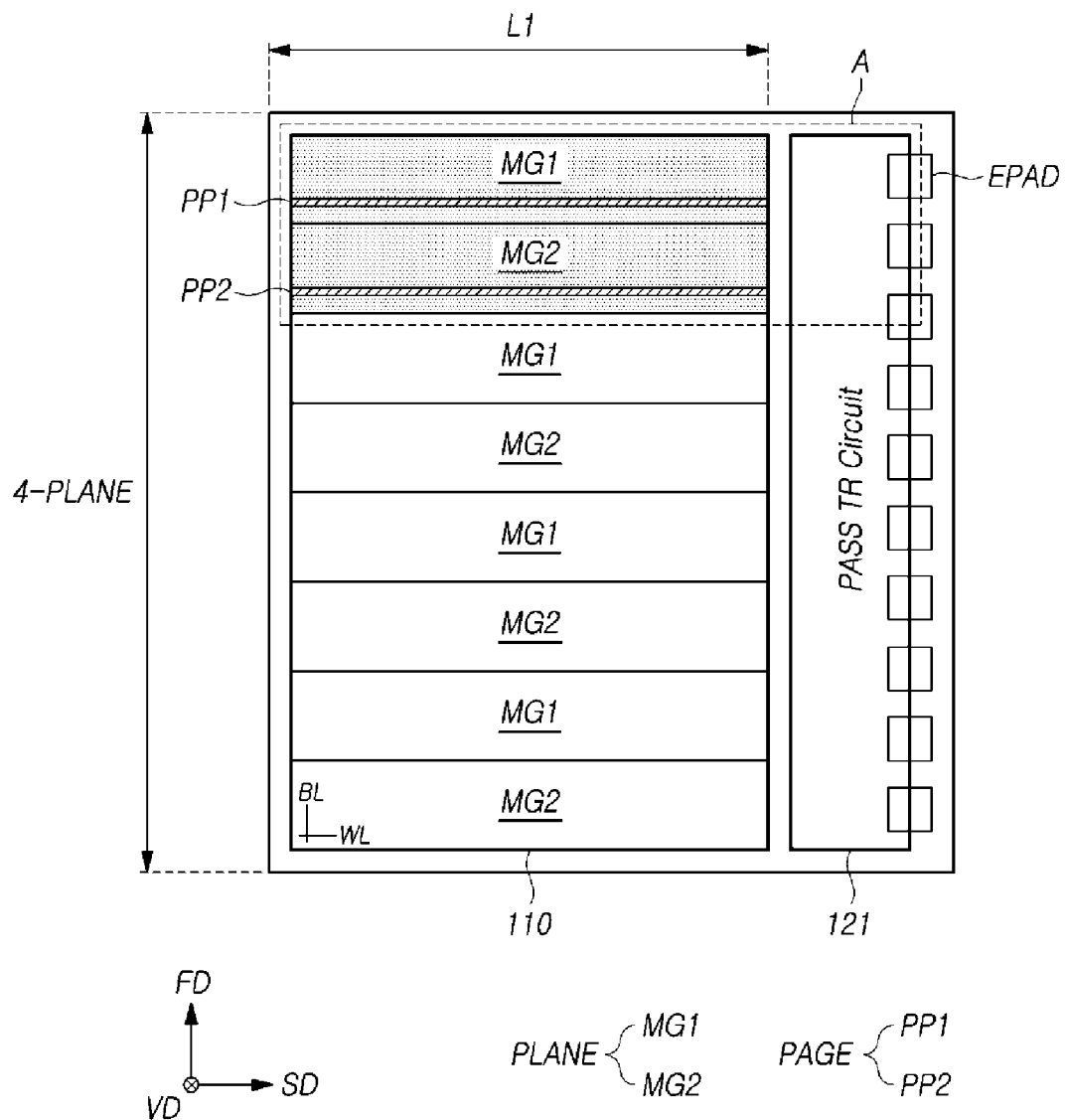
FIG. 2 is a layout diagram illustrating a partial configuration of a memory device in accordance with an embodiment of the present disclosure.
Figure 3:
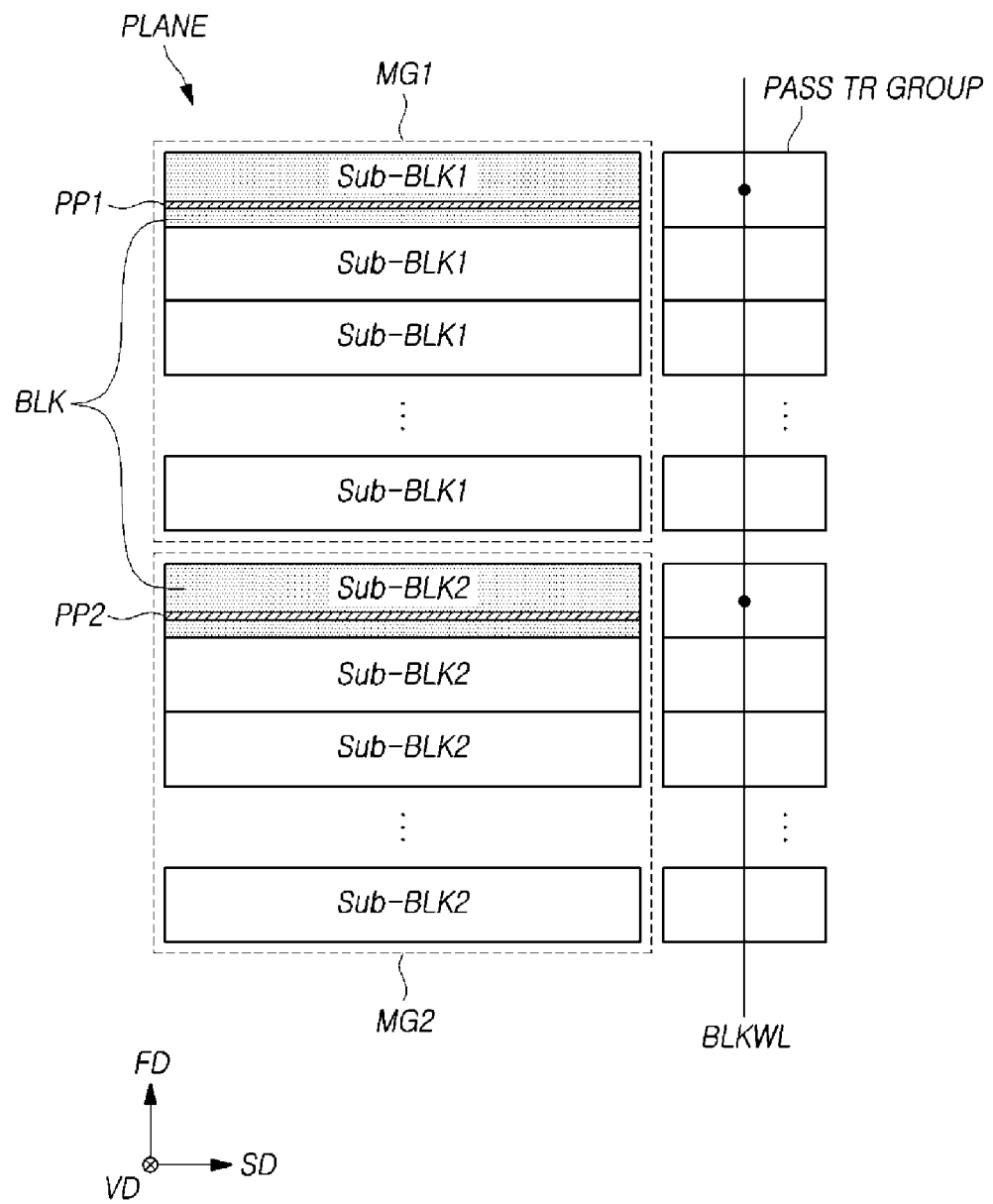
FIG. 3 is a diagram illustrating the internal structure of a part A of FIG. 2.

FIG. 2 is a layout diagram illustrating a partial configuration of a memory device in accordance with an embodiment of the present disclosure, and FIG. 3 is a diagram illustrating the internal structure of a part A of FIG. 2.

Referring to FIG. 2, a memory device may include a plurality of planes PLANE. For example, FIG. 2 illustrates four planes PLANE, and in this case, the memory device may be defined as having a four-plane structure. Although the following embodiments illustrate an example in which the number of planes PLANE is four, the number of planes PLANE is not limited thereto. The number of planes PLANE in a memory device may be one or two or more.

Each plane PLANE may be divided into memory groups. For example, in FIG. 2 each plane PLANE may include a first memory group MG1 and a second memory group MG2.

Four first memory groups MG1 and four second memory groups MG2 included in the four planes PLANE may be disposed or arranged in a line in the first direction FD to configure a cell region 110. Each plane PLANE can be characterized as having memory groups that are disposed in two rows (a row of first memory groups and a row of second memory groups) in the first direction FD.

Although not illustrated in detail, a first memory group MG1 may include a plurality of first partial pages PP1, which are arranged in the first direction FD when viewed from a top or layout view, and a second memory group MG2 may include a plurality of second partial pages PP2, which are also arranged in the first direction FD from a top view or layout view.

One of the first partial pages PP1 of a first memory group MG1 and one of the second partial pages PP2 of a second memory group MG2 may configure one page PAGE. Put another way, one page PAGE may be divided into two partial pages PP1 and PP2, and the two partial pages PP1 and PP2 are included or disposed in the first memory group MG1 and the second memory group MG2, respectively. As an example, when the page PAGE has a size of 16 kilobytes (KB), each of the first partial page PP1 and the second partial page PP2 may have a size of 8 KB.

Because the partial pages PP1 and PP2 included in each memory group MG1 or MG2 are arranged in the first direction FD, the width of each memory group MG1 or MG2 in the second direction SD may have a width corresponding to the size or width of the partial page PP1 or PP2 in the second direction SD.

As described above, because the memory groups MG1 and MG2 of the cell region 110 are disposed in a line in the first direction FD, the width of the cell region 110 in the second direction SD may have substantially the same size as the width of each memory group MG1 or MG2 in the second direction SD. The width of the cell region 110 in the second direction SD may have a size smaller than the sum of the widths, in the second direction SD, of the memory groups MG1 and MG2 included in a single plane PLANE.

For example, when the width of each memory group MG1 or MG2 in the second direction SD has a size of L1, the sum of the widths, in the second direction SD, of the memory groups MG1 and MG2 included in a single plane PLANE may have a size of 2XL1. The width of the cell region 110 in the second direction SD being L1 is the same as the width of each memory group MG1 or MG2 in the second direction SD, and corresponds to ½ of the sum of the widths, in the second direction SD, of the memory groups MG1 and MG2 included in a single plane PLANE.

As described above, if the width of each memory group MG1 or MG2 has a size corresponding to the width of one partial page PP1 or PP2 in the second direction SD, then the width of the cell region 110 in the second direction SD also has a size corresponding to the width of one partial page PP1 or PP2.

From a top view, a pass transistor circuit 121 may be configured to be adjacent to the cell region 110 in the second direction SD and to have a shape that extends in the first direction FD, which is the arrangement direction of word lines WL.

From a top view, a plurality of external coupling pads EPAD may be disposed near or in the vicinity of the cell region 110. Through the plurality of external coupling pads EPAD, the memory device may receive electrical signals, for example, a command signal, an address signal and a control signal, from an external device, such as for example a memory controller, and may exchange data with the external device.

From a top view, the plurality of external coupling pads EPAD may be disposed to be adjacent to the cell region 110 in the second direction SD. The plurality of external coupling pads EPAD may be arranged in the first direction FD.

The plurality of external coupling pads EPAD may be disposed such that at least a portion of each coupling pad overlaps with the pass transistor circuit 121 in the vertical direction VD. The arrangement direction of the external coupling pads EPAD and the extending direction of the pass transistor circuit 121 may be the same, for example in the first direction FD. Thus, when compared to a case where the arrangement direction of the external coupling pads EPAD and the extending direction of the pass transistor circuit 121 are different from each other, the number of external coupling pads EPAD that overlap with the pass transistor circuit 121 is increased. Accordingly, it is possible to increase the overlapping area between the external coupling pads EPAD and the pass transistor circuit 121 so that the size of the memory device may be reduced.

Referring to FIG. 3, a first memory group MG1 may include a plurality of first sub-blocks Sub-BLK1 that are arranged in the first direction FD. A second memory group MG2 may include a plurality of second sub-blocks Sub-BLK2 that are arranged in the first direction FD.

One of the plurality of first sub-blocks Sub-BLK1 of the first memory group MG1 and one of the plurality of second sub-blocks Sub-BLK2 of the second memory group MG2 may configure one memory block BLK. For example, one memory block BLK can be divided into two sub-blocks Sub-BLK1 and Sub-BLK2, and the two sub-blocks Sub-BLK1 and Sub-BLK2 can be separated into the first memory group MG1 and the second memory group MG2, respectively.

Although not illustrated in detail, the first sub-block Sub-BLK1 may include a plurality of first partial pages PP1, which are arranged in the first direction FD when viewed from the top, and the second sub-block Sub-BLK2 may include a plurality of second partial pages PP2, which are arranged in the first direction FD when viewed from the top.

Within a memory block BLK, one of the first partial pages PP1 of the first sub-block Sub-BLK1 and one of the second partial pages PP2 of the second sub-block Sub-BLK2 may configure one page PAGE. That is to say, one page PAGE is divided into two partial pages PP1 and PP2 and the two partial pages PP1 and PP2 are included in the first sub-block Sub-BLK1 and the second sub-block Sub-BLK2, respectively, of the memory block BLK.

As described above, because the partial pages PP1 or PP2 included in each sub-block Sub-BLK1 or Sub-BLK2 are arranged in the first direction FD, the width of each sub-block Sub-BLK1 or Sub-BLK2 in the second direction SD may have a size corresponding to the width of one partial page PP1 or PP2.

As described above with reference to FIG. 2, the memory groups MG1 and MG2 configuring the cell region 110 (see FIG. 2) are disposed in a line in the first direction FD and the sub-blocks Sub-BLK1 or Sub-BLK2 included in each memory group MG1 or MG2 are arranged in a line in the first direction FD. As a result, the width of the cell region 110 (see FIG. 2) in the second direction SD may have substantially the same size as the width of each sub-block Sub-BLK1 or Sub-BLK2 in the second direction SD. The width of the cell region 110 (see FIG. 2) in the second direction SD may have a size smaller than the sum of the widths, in the second direction SD, of the sub-blocks Sub-BLK1 and Sub-BLK2 included in a single memory block BLK.

The pass transistor circuit 121 (see FIG. 2) may include a plurality of pass transistor groups PASS TR GROUP corresponding to the sub-blocks Sub-BLK1 and Sub-BLK2, respectively. The pass transistor groups PASS TR GROUP may be disposed in a line in the first direction FD, which is the arrangement direction of the sub-blocks Sub-BLK1 and Sub-BLK2, such that each pass transistor group PASS TR GROUP is adjacent to a corresponding sub-block Sub-BLK1 or Sub-BLK2 in the second direction SD.

Each pass transistor group PASS TR GROUP may be coupled to a block switch circuit (see 122 of FIG. 1) through a block word line BLKWL (not illustrated), which is provided with a block selection signal from the block switch circuit, and may be activated in response to the block selection signal to transfer an operating voltage to the word lines WL (see FIG. 2) of a corresponding sub-block Sub-BLK1 or Sub-BLK2.

Two pass transistor groups PASS TR GROUP corresponding respectively to two sub-blocks Sub-BLK1 and Sub-BLK2 included in a single memory block BLK may be coupled in common to one block word line BLKWL, and the two pass transistor groups may be provided with the block selection signal from the block switch circuit (see 122 of FIG. 1) through the one block word line BLKWL. Accordingly, the two pass transistor groups PASS TR GROUP may be activated at the same time, and may simultaneously transfer an operating voltage to the two sub-blocks Sub-BLK1 and Sub-BLK2 included in the single memory block BLK.

In other words, because the sub-blocks Sub-BLK1 and Sub-BLK2 of the single memory block BLK are simultaneously provided with the operating voltage, the pass transistor groups PASS TR GROUP corresponding to the sub-blocks Sub-BLK1 and Sub-BLK2 of the single memory block BLK may be configured to share the one block word line BLKWL.

The embodiments described above with reference to FIGS. 2 and 3 illustrate that each plane PLANE is divided into two memory groups MG1 and MG2, each memory block BLK is divided into two sub-blocks Sub-BLK1 and Sub-BLK2 and each page PAGE is divided into two partial pages PP1 and PP2, but embodiments contemplated by this disclosure are not limited to these figures. In other embodiments, each plane PLANE may be divided into a plurality of memory groups, each memory block BLK may be divided into the same number of sub-blocks as the number of memory groups included in a single plane PLANE, and each page PAGE may be divided into the same number of partial pages as the number of memory groups included in the single plane PLANE, as a non-limiting example.

Figure 4:
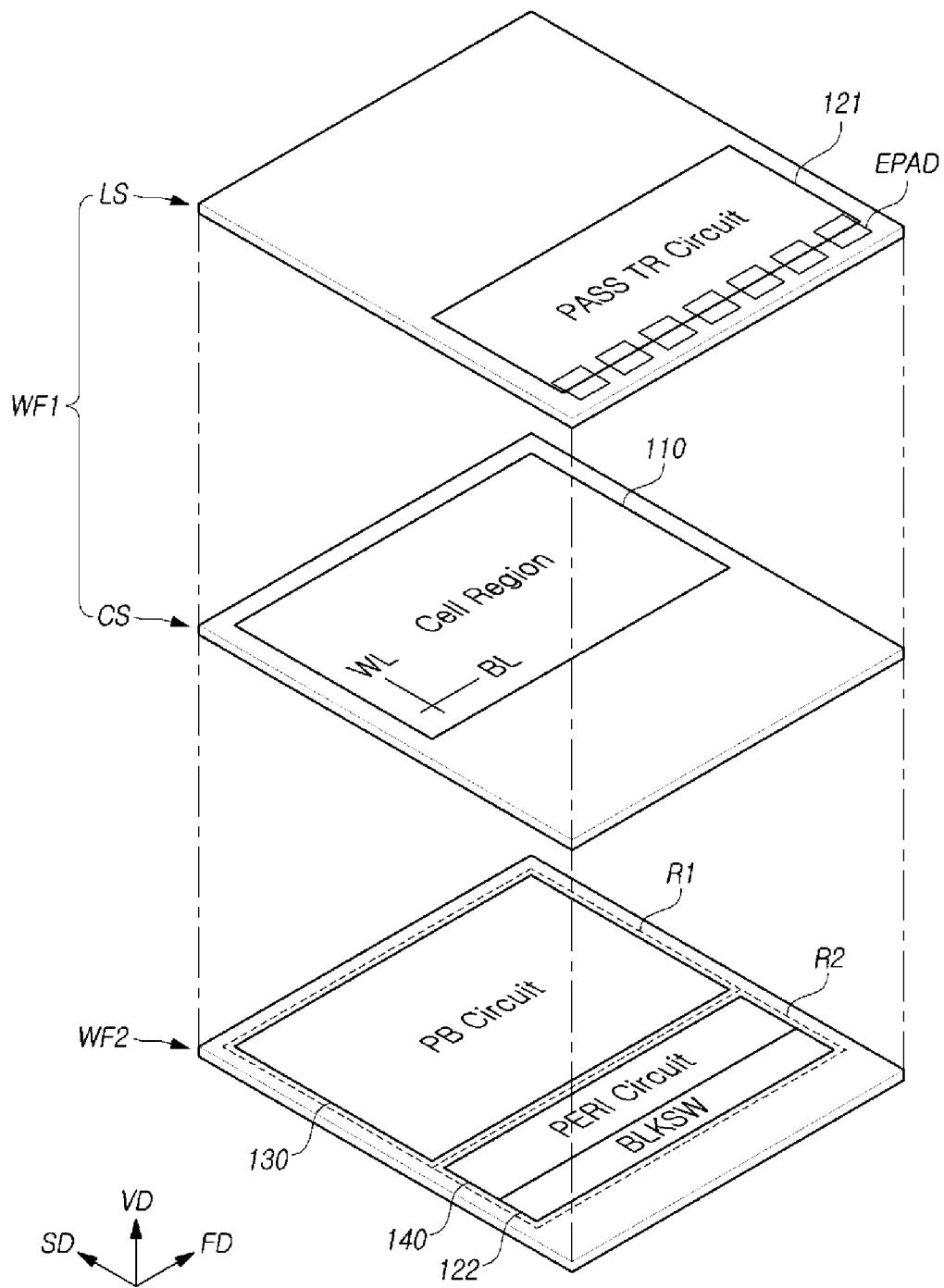
FIG. 4 is a diagram illustrating the schematic layout of a memory device in accordance with an embodiment of the present disclosure.
Figure 5:
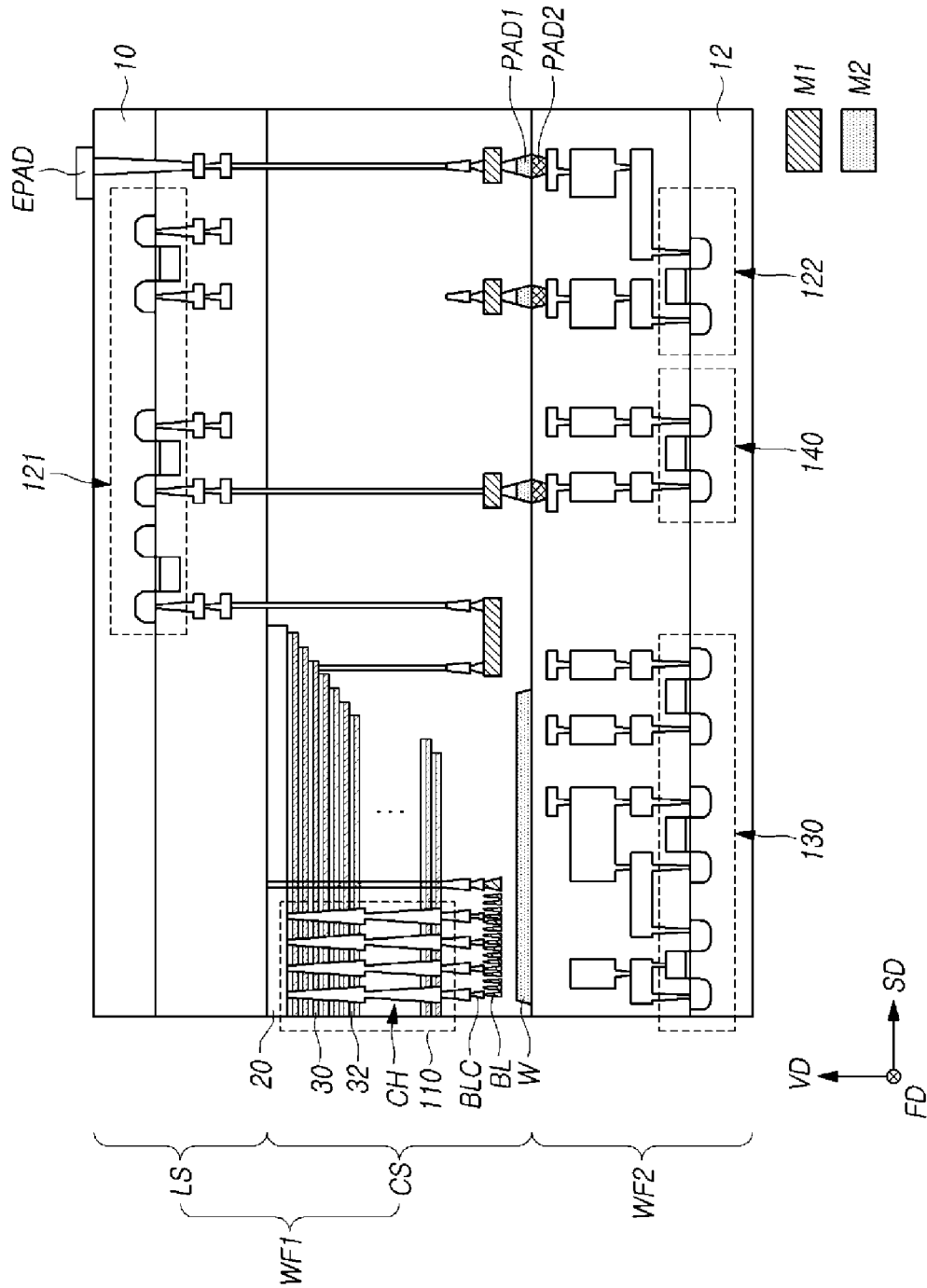
FIG. 5 is an exemplary cross-sectional view of a memory device illustrated in FIG. 4.
Figure 6:
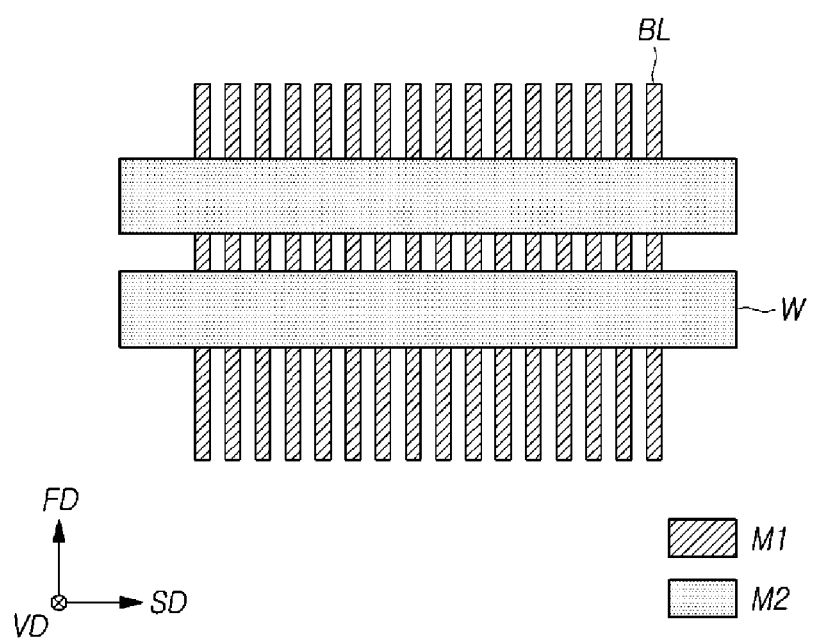
FIG. 6 is a layout diagram illustrating bit lines and metal lines of FIG. 5.
Figure 7:
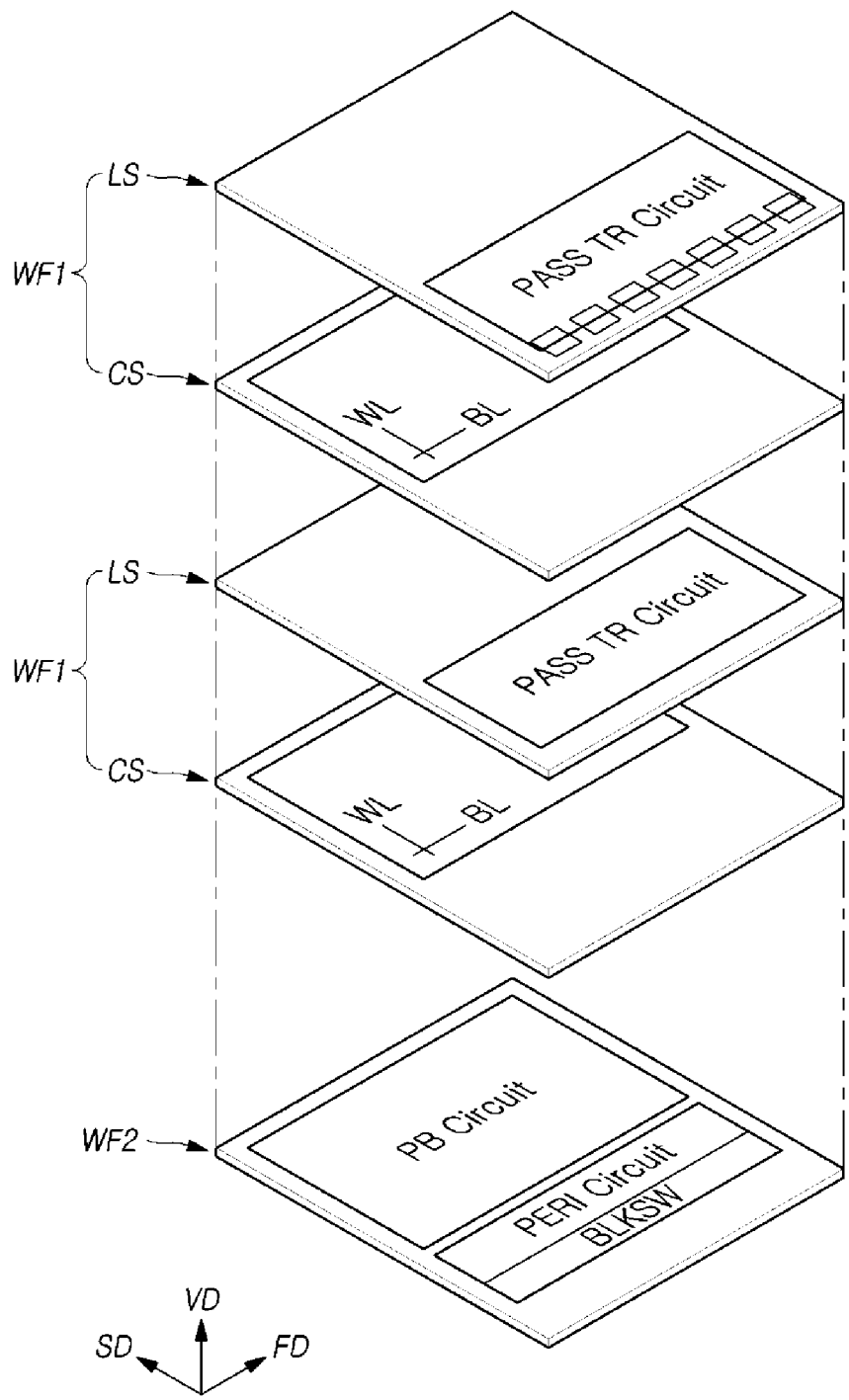
FIGS. 7 and 8 are diagrams illustrating schematic layouts of memory devices in accordance with other embodiments of the present disclosure.
Figure 8:
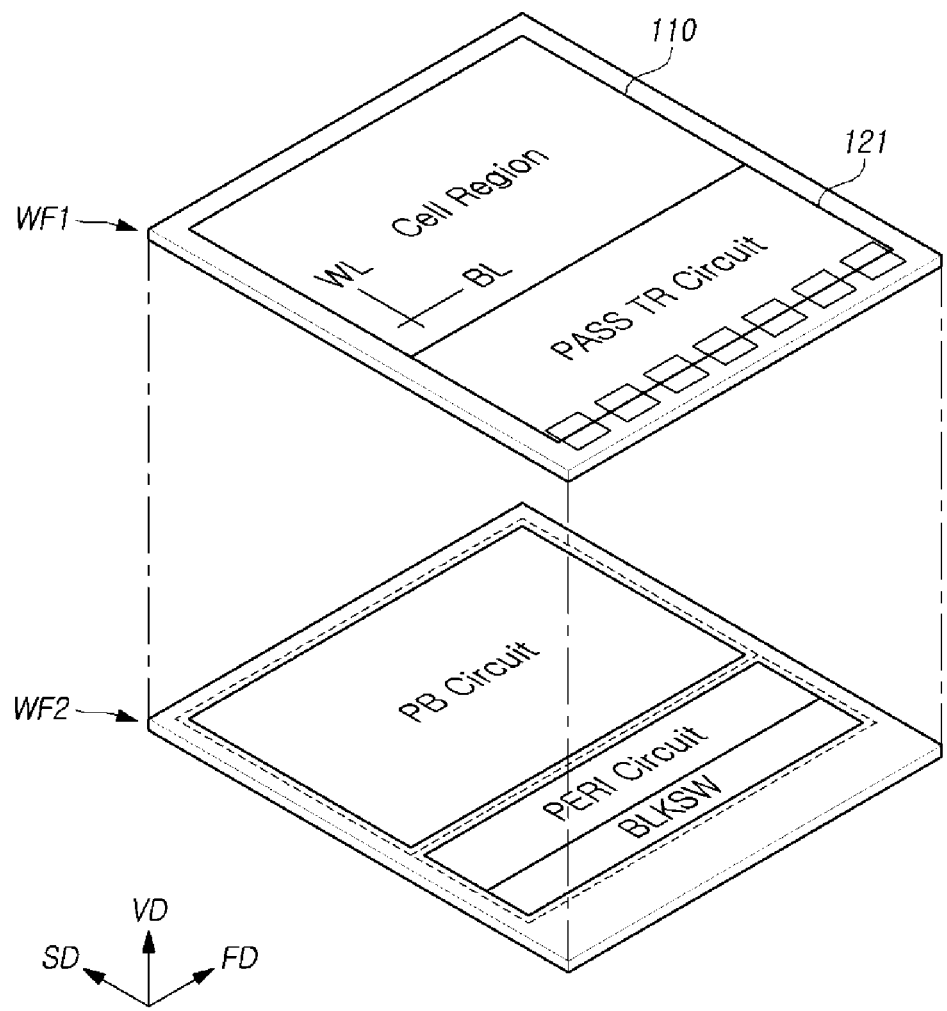

FIG. 4 is a diagram illustrating the schematic layout of a memory device in accordance with an embodiment of the present disclosure, FIG. 5 is an exemplary cross-sectional view of a memory device illustrated in FIG. 4, FIG. 6 is a layout diagram illustrating bit lines and metal lines of FIG. 5, and FIGS. 7 and 8 are diagrams illustrating schematic layouts of memory devices in accordance with other embodiments of the present disclosure.

Referring to FIG. 4, a memory device in accordance with an embodiment of the present disclosure may include a first wafer WF1 and a second wafer WF2, which is disposed under the first wafer WF1. The first wafer WF1 and the second wafer WF2 may be bonded to each other by a bonding technique. The first wafer WF1 may include a logic structure LS and a cell structure CS, which is disposed under the logic structure LS.

In order to facilitate understanding, FIG. 4 includes an exploded view in which the bottom surface of the logic structure LS and the top surface of the cell structure CS are separated from each other and the bottom surface of the first wafer WF1 and the top surface of the second wafer WF2 are separated from each other. However, it should be understood that the bottom surface of the logic structure LS and the top surface of the cell structure CS are in contact with each other and that the bottom surface of the first wafer WF1 and the top surface of the second wafer WF2 are in contact with each other.

A pass transistor circuit 121 may be disposed in the logic structure LS. A cell region 110 may be disposed in the cell structure CS. A page buffer circuit 130, a peripheral circuit 140 and a block switch circuit 122 may be disposed in the second wafer WF2.

When viewed from the top, the pass transistor circuit 121 may be configured to be adjacent to the cell region 110 in the second direction SD and to have a shape that extends in the first direction FD, which is the arrangement direction of word lines WL.

External coupling pads EPAD may be disposed in the first direction FD on the top surface of the first wafer WF1. As described above with reference to FIG. 2, at least portions of the external coupling pads EPAD may overlap with the pass transistor circuit 121 in the vertical direction VD.

The second wafer WF2 includes a first region R1, which overlaps with the cell region 110 in the vertical direction VD, and a second region R2, which overlaps with the pass transistor circuit 121 in the vertical direction VD.

The page buffer circuit 130 may be disposed in the first region R1 of the second wafer WF2. The page buffer circuit 130 may overlap with the memory cell array 110 in the vertical direction VD. The block switch circuit 122 and the peripheral circuit 140 may be disposed in the second region R2 of the second wafer WF2. The block switch circuit 122 and the peripheral circuit 140 may overlap with the pass transistor circuit 121 in the vertical direction VD.

While FIG. 4 illustrates that second wafer WF2 as disposed under the first wafer WF1 and the cell structure CS as disposed under the logic structure LS, the present disclosure is not limited thereto. For example, the second wafer WF2 may be disposed on the first wafer WF1, and the cell structure CS may be disposed on the logic structure LS.

Referring to FIG. 5, the first wafer WF1 may include a first substrate 10, and the second wafer WF2 may include a second substrate 12.

Each of the first substrate 10 and the second substrate 12 may be a single crystal semiconductor layer. For example, each of the first substrate 10 and the second substrate 12 may be a bulk silicon substrate, a silicon-on-insulator substrate, a germanium substrate, a germanium-on-insulator substrate, a silicon-germanium substrate, or an epitaxial thin film formed through selective epitaxial growth.

The pass transistor circuit 121 may be configured on the bottom, in the vertical direction VD, of the first substrate 10. The cell structure CS may include a source plate 20 that is disposed under the logic structure LS, a plurality of electrode layers 30 and a plurality of interlayer dielectric layers 32, which are alternately stacked under the source plate 20, and a plurality of vertical channels CH that extend to the source plate 20 by passing through the plurality of electrode layers 30 and the plurality of interlayer dielectric layers 32 in the vertical direction VD.

The source plate 20 may include a semiconductor material, for example, a group IV semiconductor, a group III-V compound semiconductor or a group II-VI compound semiconductor. For example, the group IV semiconductor may include silicon, germanium or silicon-germanium. For example, the source plate 20 may be provided as a polycrystalline layer or an epitaxial layer.

The electrode layers 30 may include a conductive material. For example, the electrode layers 30 may include at least one selected from among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). Among the electrode layers 30, at least one electrode layer 30 from the uppermost electrode layer 30 may configure a source select line. Among the electrode layers 30, at least one electrode layer 30 from the lowermost electrode layer 30 may configure a drain select line. The electrode layers 30 between the source select line and the drain select line may configure word lines. The interlayer dielectric layers 32 may include silicon oxide.

Each of the electrode layers 30 may be electrically coupled to the pass transistor circuit 121, and may be provided with an operating voltage from the pass transistor circuit 121.

Although not illustrated in detail, each of the vertical channels CH may include a channel layer and a gate dielectric layer. The channel layer may include polysilicon or monocrystalline silicon, and may include, in some regions thereof, a p-type impurity such as boron (B). The gate dielectric layer may have a shape that surrounds the outer wall of the channel layer. The gate dielectric layer may include a tunnel dielectric layer, a charge storage layer and a blocking layer, which are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. A source select transistor may be configured in areas or regions where the source select line surrounds the vertical channel CH. Memory cells may be configured in areas or regions where the word lines surround the vertical channel CH. A drain select transistor may be configured in areas or regions where the drain select line surrounds the vertical channel CH. A source select transistor, a plurality of memory cells and a drain select transistor that are disposed along one vertical channel CH may configure one cell string. The cell region 110 may include a plurality of cell strings corresponding to the plurality of vertical channels CH.

The cell structure CS may include a first wiring layer M1 and a second wiring layer M2. The second wiring layer M2 may overlap with the first wiring layer M1 in the vertical direction VD. For example, the second wiring layer M2 may be a wiring layer adjacent to the first wiring layer M1 in the vertical direction VD.

A plurality of bit lines BL may be disposed in the first wiring layer M1. Each of the vertical channels CH may be coupled to a corresponding bit line BL through a bit line contact BLC.

A metal line W may be disposed in the second wiring layer M2. Although FIG. 5 illustrates only one metal line W, it should be understood that a plurality of metal lines W are disposed in the second wiring layer M2.

Although not illustrated, a metal line W may be coupled to an external coupling pad EPAD to function to transfer an external signal, inputted through the external coupling pad EPAD, to the device interior or transfer an internal signal to the external coupling pad EPAD.

To facilitate signal transfer, the metal line W is configured to extend in a direction intersecting with the arrangement direction of the external coupling pads EPAD. As described above with reference to FIG. 4, because the external coupling pads EPAD are arranged in the first direction FD, the metal lines W may extend in the second direction SD, which is a direction that intersects with the first direction FD.

Referring to FIG. 6, the bit lines BL may extend in the first direction FD and the metal lines W may extend in the second direction SD. The bit lines BL and the metal lines W from a top view may overlap with each other only at intersections where the bit lines BL and the metal lines W intersect with each other.

Referring back to FIG. 5, the second wiring layer M2 may be disposed on the bottom surface of the first wafer WF1, which is bonded to the second wafer WF2. A plurality of first bonding pads PAD1 may be configured in the second wiring layer M2. Each of the first bonding pads PAD1 may be coupled to at least one of the bit lines BL, the pass transistor circuit 121 and the external coupled pads EPAD.

The page buffer circuit 130, the peripheral circuit 140 and the block switch circuit 122 may be configured on the second substrate 12. The second wafer WF2 may include a plurality of second bonding pads PAD2 on the top surface, which is bonded to the first wafer WF1. Each of the second bonding pads PAD2 may be coupled to at least one of the page buffer circuit 130, the peripheral circuit 140 and the block switch circuit 122.

Each of the plurality of second bonding pads PAD2 may be bonded to a corresponding first bonding pad PAD1 to configure electrical paths that couple the first wafer WF1 and the second wafer WF2. For example, in this manner, an electrical path that couples the external coupling pad EPAD and the peripheral circuit 140, an electrical path that couples the bit line BL and the page buffer circuit 130 and an electrical path that couples the pass transistor circuit 121 and the block switch circuit 122 may be configured.

While the embodiments described above with reference to FIGS. 4 and 5 illustrate that one first wafer WF1 is stacked on the second wafer WF2, the present disclosure is not limited thereto. The number of first wafers WF1 stacked on the second wafer WF2 may be two as illustrated in FIG. 7, or may be three or more (not illustrated).

The embodiments described above with reference to FIGS. 4 to 7 illustrate that the cell region 110 is disposed in the cell structure CS and the pass transistor circuit 121 is disposed in the logic structure LS, which overlaps with the cell structure CS in the vertical direction VD. The present disclosure, however, is not limited to such embodiments. As illustrated in FIG. 8, the pass transistor circuit 121 and the cell region 110 may be disposed in a single structure and in substantially the same plane, such as for example in first wafer WF1.

Figure 9:
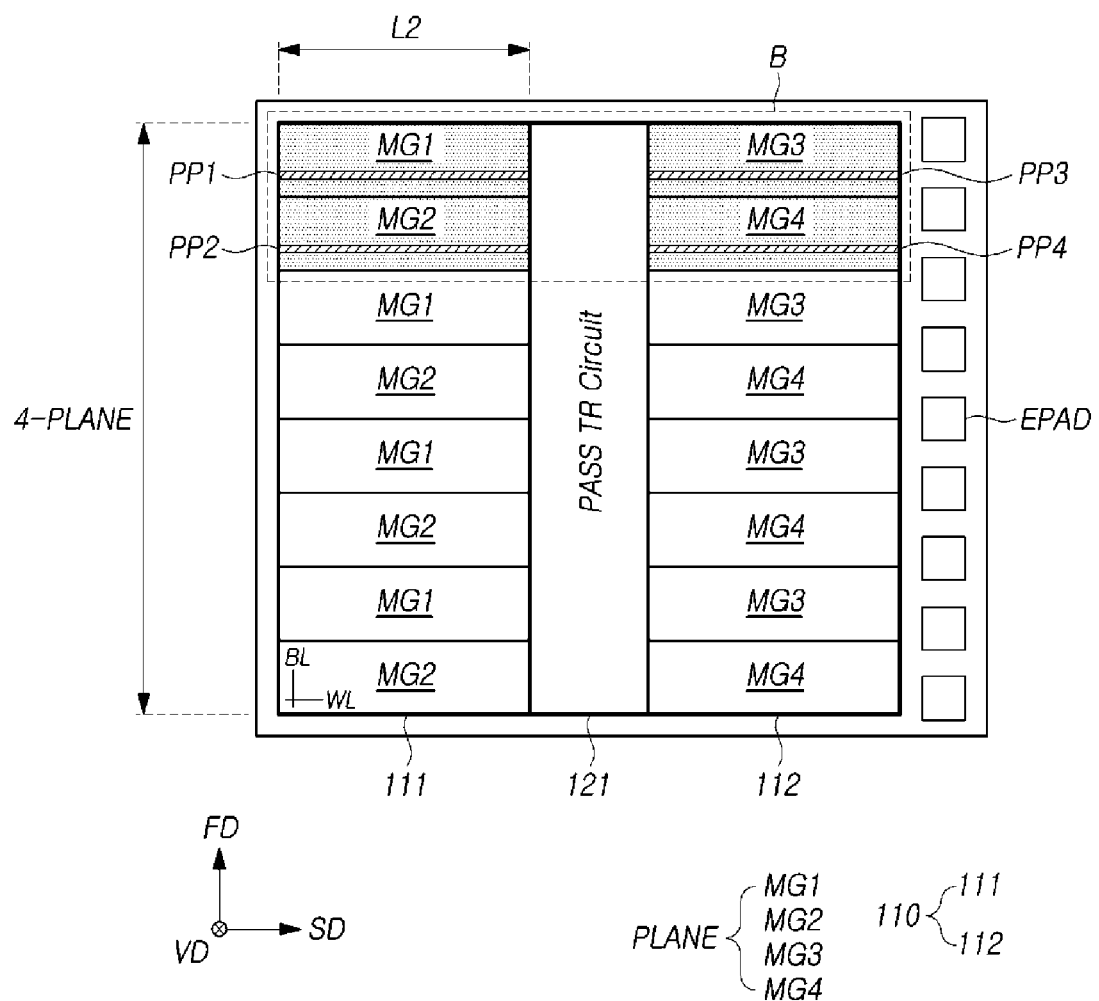
FIG. 9 is a layout diagram illustrating a partial configuration of a memory device in accordance with another embodiment of the present disclosure.
Figure 10:
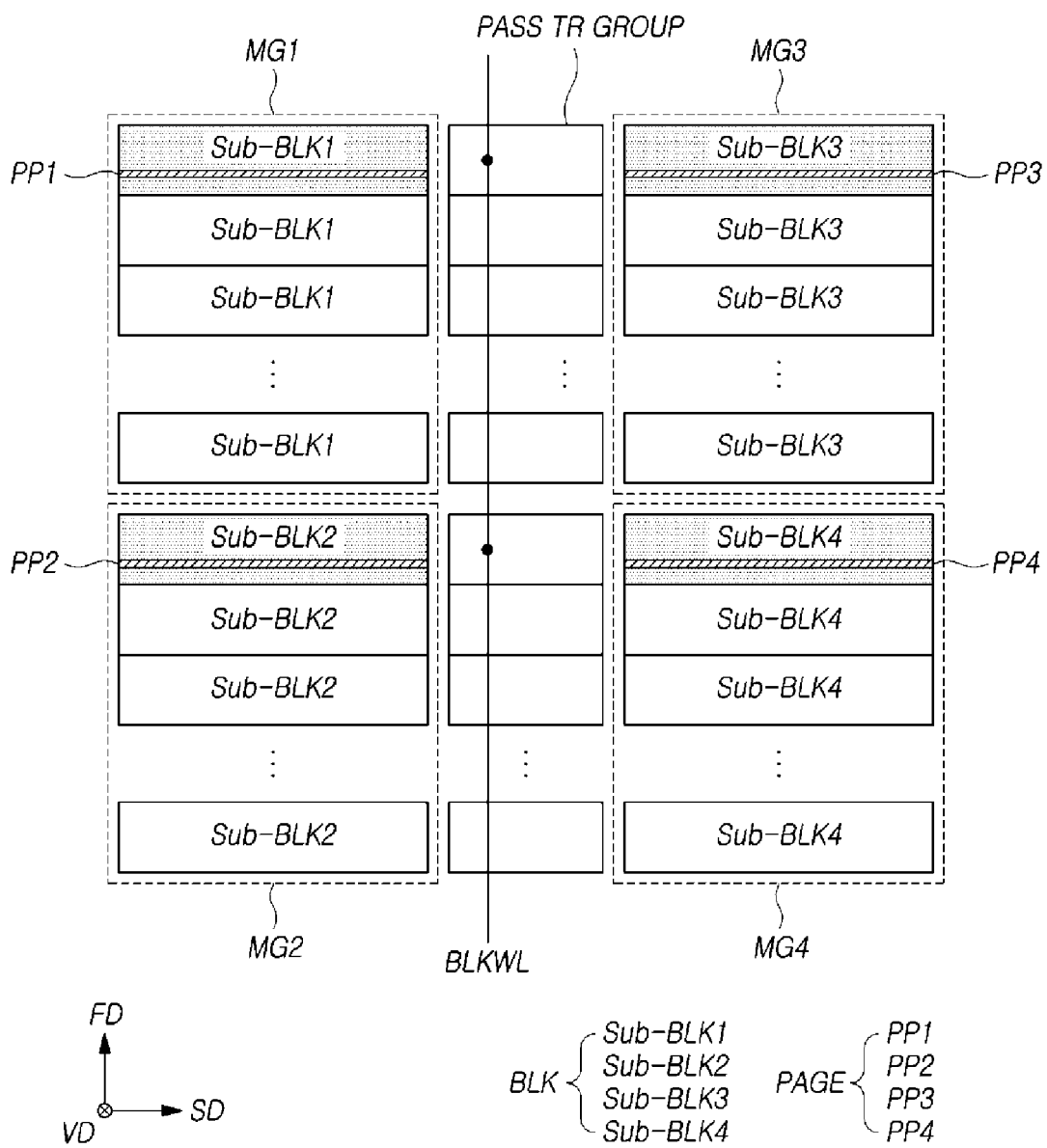
FIG. 10 is a diagram illustrating an internal structure of a part B of FIG. 9.

FIG. 9 is a layout diagram illustrating a partial configuration of a memory device in accordance with another embodiment of the present disclosure, FIG. 10 is a diagram illustrating an internal structure of a part B of FIG. 9, and FIGS. 11 to 13 are layout diagrams illustrating various layout structures of memory groups configuring a single plane.

Referring to FIG. 9, each plane PLANE may be divided into four memory groups MG1 to MG4. Each plane PLANE may include first to fourth memory groups MG1 to MG4.

The memory groups MG1 to MG4 included in each plane PLANE may be disposed in a 2×2 matrix form in the first direction FD and the second direction SD. Thus, each plane PLANE may be disposed in two rows extending in the first direction FD. A pass transistor circuit 121 may be disposed between these two rows.

Four first memory groups MG1 and four second memory groups MG2 included in the four planes PLANE may be disposed in a line or row extending in the first direction FD to configure a first sub-cell region 111. Similarly, four third memory group3 MG3 and four fourth memory groups MG4 included in the four planes PLANE may be disposed in a line or row extending in the first direction FD to configure a second sub-cell region 112.

The first sub-cell region 111 and the second sub-cell region 112 may be disposed on both sides of a pass transistor circuit 121 in the second direction SD. As a result, a cell region 110 can be divided into the first sub-cell region 111 and the second sub-cell region 112 that are disposed on both sides of the pass transistor circuit 121 in the second direction SD. A structure in which, as described above, the pass transistor circuit 121 is disposed at a center portion and the cell region 110 is divided into the first sub-cell region 111 and the second sub-cell region 112 to be disposed on both sides of the pass transistor circuit 121 may be defined as a centered row decoder (X-DEC) structure.

Although not illustrated in detail, the first memory group MG1 may include a plurality of first partial pages PP1, which are arranged in the first direction FD from a top view, and the second memory group MG2 may include a plurality of second partial pages PP2, which are arranged in the first direction FD from a top view. Further, the third memory group MG3 may include a plurality of third partial pages PP3, which are arranged in the first direction FD when viewed from the top, and the fourth memory group MG4 may include a plurality of fourth partial pages PP4, which are arranged in the first direction FD when viewed from the top.

One of the first partial pages PP1 of the first memory group MG1, one of the second partial pages PP2 of the second memory group MG2, one of the third partial pages PP3 of the third memory group MG3 and one of the fourth partial pages PP4 of the fourth memory group MG4 may configure one page PAGE. That is, one page PAGE can be divided into four partial pages PP1, PP2, PP3 and PP4, and these four partial pages PP1, PP2, PP3 and PP4 are included in the first to fourth memory groups MG1 to MG4, respectively. For example, when the page PAGE has a size of 16 KB, each of the first partial page PP1, the second partial page PP2, the third partial page PP3 and the fourth partial page PP4 may have a size of 4 KB.

The width of each memory group MG1, MG2, MG3 or MG4 in the second direction SD has a size corresponding to the width of the partial page PP1, PP2, PP3 or PP4, respectively, because the partial pages PP1, PP2, PP3 or PP4 included in each memory group MG1, MG2, MG3 or MG4 are arranged in the first direction FD.

Therefore, the width of the first sub-cell region 111 in the second direction SD may have substantially the same size as the width of one memory group MG1 or MG2 in the second direction SD because the four first memory groups MG1 and the four second memory groups MG2 included in the four planes PLANE are arranged in a line or row extending in the first direction FD to form the first sub-cell region 111. Similarly, since the four third memory groups MG3 and the four fourth memory groups MG4 included in the four planes PLANE are arranged in a line or row extending in the first direction FD to form the second sub-cell region 112, the width of the second sub-cell region 112 in the second direction SD may have substantially the same size as the width of one memory group MG3 or MG4 in the second direction SD.

As described above, the width of each memory group MG1, MG2, MG3 or MG4 in the second direction SD has a size corresponding to the size of the partial page PP1, PP2, PP3 or PP4, so the width of the first sub-cell region 111 and the second sub-cell region 112 in the second direction SD may also have a size corresponding to the size of the partial page PP1, PP2, PP3 or PP4.

The width of each sub-cell region 111 or 112 in the second direction SD may have a size smaller than half the sum of the widths, in the second direction SD, of the memory groups MG1 to MG4 included in a single plane PLANE, and the width of the cell region 110 in the second direction SD may have a size smaller than the sum of the widths, in the second direction SD, of the memory groups MG1 to MG4 included in the single plane PLANE.

For example, when the width of each memory group MG1, MG2, MG3 or MG4 in the second direction SD has a size of L2, the sum of the widths, in the second direction SD, of the memory groups MG1 to MG4 included in a single plane PLANE may have a size of four times L2 (4XL2). Because L2 is the same as the width of each memory group MG1, MG2, MG3 or MG4 in the second direction SD, the width of each sub-cell region 111 or 112 in the second direction SD corresponds to ¼ of the sum of the widths, in the second direction SD, of the memory groups MG1 to MG4 included in a single plane PLANE. The width of the cell region 110 in the second direction SD has a size of at least two times L2 (2XL2), which may correspond to the sum of the width of the first sub-cell region 111 in the second direction SD and the width of the second sub-cell region 112 in the second direction SD, and may correspond to ½ of the sum of the widths, in the second direction SD, of the memory groups MG1 to MG4 included in a single plane PLANE.

Referring to FIG. 10, the first memory group MG1 may include a plurality of first sub-blocks Sub-BLK1, which are arranged in the first direction FD. The second memory group MG2 may include a plurality of second sub-blocks Sub-BLK2, which are arranged in the first direction FD. The third memory group MG3 may include a plurality of third sub-blocks Sub-BLK3, which are arranged in the first direction FD. The fourth memory group MG4 may include a plurality of fourth sub-blocks Sub-BLK4, which are arranged in the first direction FD.

Since the sub-blocks Sub-BLK1, Sub-BLK2, Sub-BLK3 and Sub-BLK4 included in each memory group MG1, MG2, MG3 and MG4, respectively, are arranged in the first direction FD within each memory group, the width of each memory group MG1, MG2, MG3 or MG4 in the second direction SD may be substantially the same as the width of the sub-blocks Sub-BLK1, Sub-BLK2, Sub-BLK3 or Sub-BLK4 in the second direction SD.

One of the first sub-blocks Sub-BLK1 of the first memory group MG1, one of the second sub-blocks Sub-BLK2 of the second memory group MG2, one of the third sub-blocks Sub-BLK3 of the third memory group MG3 and one of the fourth sub-blocks Sub-BLK4 of the fourth memory group MG4 may configure one memory block BLK. Put another way one memory block BLK is divided into four sub-blocks Sub-BLK1 to Sub-BLK4, and these four sub-blocks Sub-BLK1 to Sub-BLK4 are distributed among the first to fourth memory groups MG1 to MG4, respectively.

Although not illustrated in detail, a first sub-block Sub-BLK1 may include a plurality of first partial pages PP1, which are arranged in the first direction FD when viewed from the top. A second sub-block Sub-BLK2 may include a plurality of second partial pages PP2, which are arranged in the first direction FD when viewed from the top. A third sub-block Sub-BLK3 may include a plurality of third partial pages PP3, which are arranged in the first direction FD when viewed from the top. A fourth sub-block Sub-BLK4 may include a plurality of fourth partial pages PP4, which are arranged in the first direction FD when viewed from the top.

In a single memory block BLK, one of the first partial pages PP1 of the first sub-block Sub-BLK1, one of the second partial pages PP2 of the second sub-block Sub-BLK2, one of the third partial pages PP3 of the third sub-block Sub-BLK3 and one of the fourth partial pages PP4 of the fourth sub-block Sub-BLK4 may configure one page PAGE. Put another way, one page PAGE can be divided into four partial pages PP1 to PP4, and these four partial pages PP1 to PP4 may be disposed in the first to fourth sub-blocks Sub-BLK1 to Sub-BLK4, respectively.

As described above, since the partial pages PP1, PP2, PP3 and PP4 included in each sub-block Sub-BLK1, Sub-BLK2, Sub-BLK3 and Sub-BLK4, respectively, are arranged in the first direction FD, the width of each sub-block Sub-BLK1, Sub-BLK2, Sub-BLK3 or Sub-BLK4 in the second direction SD may have a size corresponding to the size or width of the partial pages PP1, PP2, PP3 or PP4, respectively.

As described above, the width of each memory group MG1, MG2, MG3 or MG4 in the second direction SD is substantially the same as the width of its sub-block Sub-BLK1, Sub-BLK2, Sub-BLK3 or Sub-BLK4 in the second direction SD. Furthermore, as described above with reference to FIG. 9, the width of each sub-cell region 111 or 112 in the second direction SD has substantially the same size as the width of one memory group MG1, MG2, MG3 or MG4 in the second direction SD, so the width of each sub-cell region 111 or 112 in the second direction SD has substantially the same size as the width of one sub-block Sub-BLK1, Sub-BLK2, Sub-BLK3 or Sub-BLK4 in the second direction SD. The width of each sub-cell region 111 or 112 in the second direction SD may have a size smaller than the sum of the widths, in the second direction SD, of the sub-blocks Sub-BLK1 to Sub-BLK4 included in a single memory block BLK.

The pass transistor circuit 121 (see FIG. 9) may include a plurality of pass transistor groups PASS TR GROUP, with pass transistor groups PASS TR GROUP corresponding to each of the sub-blocks Sub-BLK1 to Sub-BLK4.

Each pass transistor group PASS TR GROUP may be coupled in common to two sub-blocks positioned on opposite sides of the pass transistor group PASS TR GROUP in the second direction SD. The pass transistor group PASS TR GROUP may provide an operating voltage to the two sub-blocks on either side such that the two sub-blocks share one pass transistor group PASS TR GROUP.

Two pass transistor groups PASS TR GROUP corresponding to four sub-blocks Sub-BLK1 to Sub-BLK4 included in a single memory block BLK may be coupled in common to one block word line BLKWL, and may be provided with a block selection signal through the one block word line BLKWL. Accordingly, the two pass transistor groups PASS TR GROUP may be activated at the same time, and may simultaneously transfer an operating voltage to the four sub-blocks Sub-BLK1 to Sub-BLK4 included in the single memory block BLK.

While the embodiments described above with reference to FIG. 9 illustrate memory groups MG1 to MG4 included in a single plane PLANE disposed in a matrix form in the first direction FD and the second direction SD, the present disclosure is not limited thereto.

Figure 11:
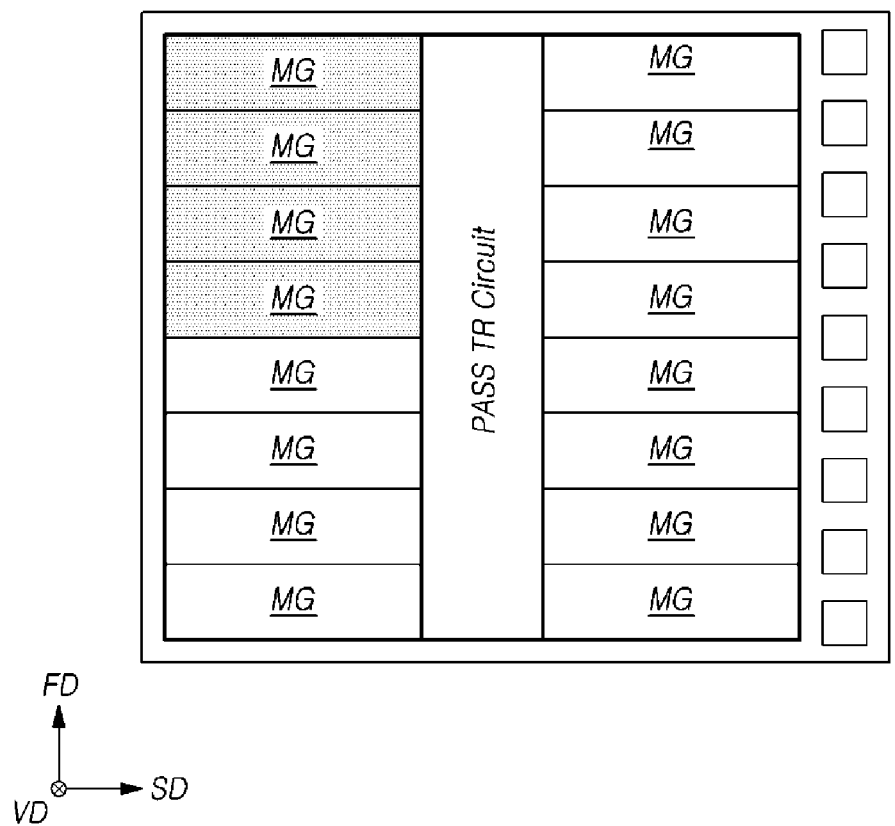
FIGS. 11 to 13 are layout diagrams illustrating various layout structures of memory groups configuring a single plane.

For example, as illustrated in FIG. 11, four memory groups MG included in each plane PLANE may be disposed in a line in the first direction FD. In this case, it may be regarded that each plane PLANE is disposed in four rows that are arranged in the first direction FD.

Figure 12:
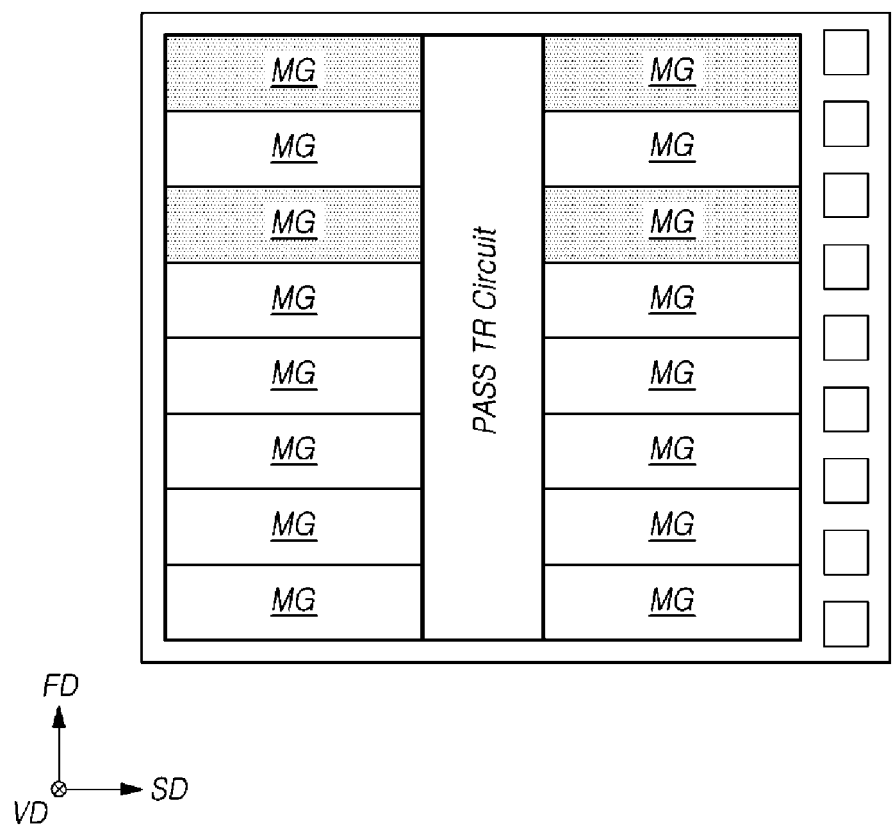

As another example, as illustrated in FIG. 12, memory groups MG included in a single plane PLANE may be spaced apart from each other in the first direction FD, with memory groups MG of another plane PLANE interposed therebetween.

Figure 13:
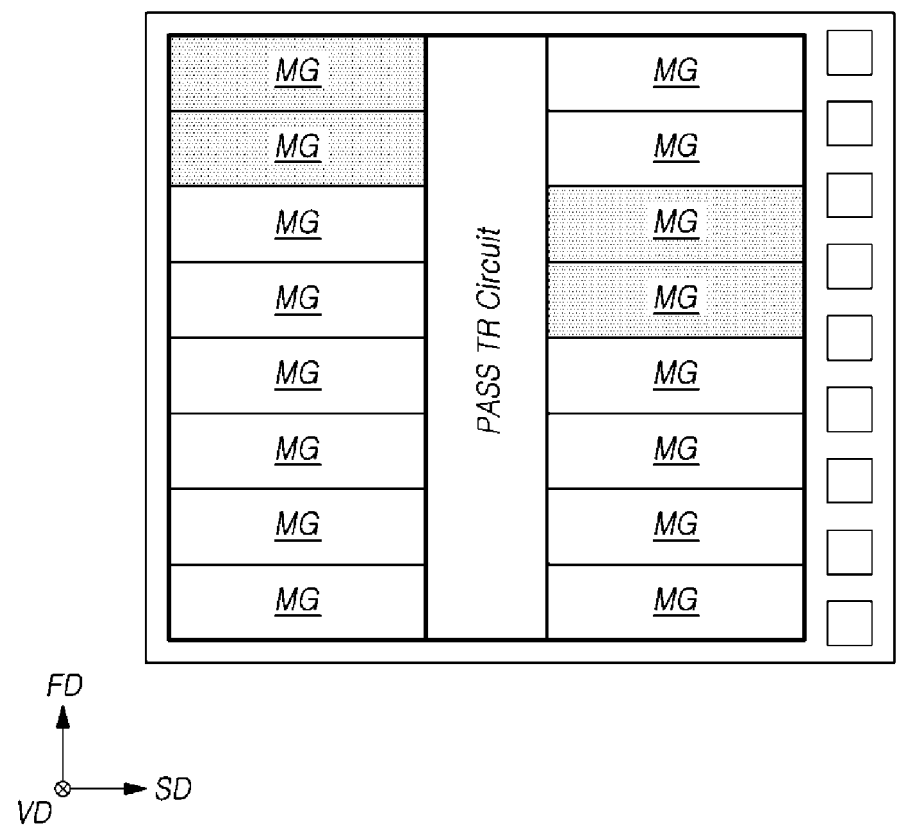

As still another example, as illustrated in FIG. 13, among memory groups MG included in a single plane PLANE, memory groups MG disposed in a first sub-cell region 111 and memory groups MG disposed in a second sub-cell region 112 may be disposed not to be adjacent to each other in the second direction SD.

Figure 14:
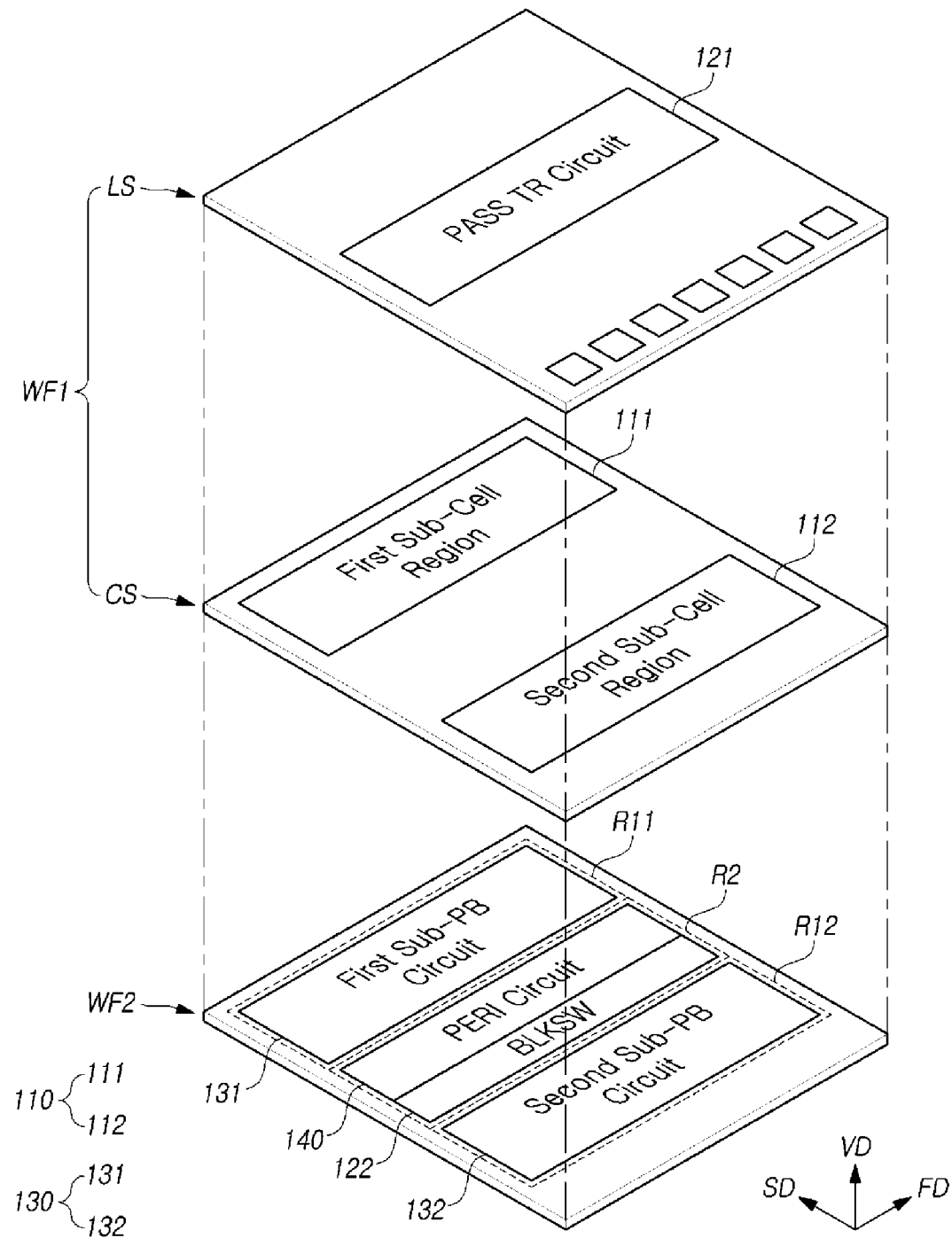
FIG. 14 is a diagram illustrating a schematic layout of a memory device illustrated in FIG. 9.

FIG. 14 is a diagram illustrating a schematic layout of a memory device illustrated in FIG. 9.

Referring to FIG. 14, a cell region 110 may be divided into a first sub-cell region 111 and a second sub-cell region 112, and the first sub-cell region 111 and the second sub-cell region 112 may be disposed in a cell structure CS. The first sub-cell region 111 and the second sub-cell region 112 may be spaced apart from each other in the second direction SD.

The pass transistor circuit 121 is disposed in a logic structure LS, and in a layout view in the vertical direction VD, may be disposed between the first sub-cell region 111 and the second sub-cell region 112.

A second wafer WF2 may include two first regions R11 and R12, which overlap with the first sub-cell region 111 and the second sub-cell region 112, respectively, in the vertical direction VD, and a second region R2 that overlaps with the pass transistor circuit 121 in the vertical direction VD.

A page buffer circuit 130 may be divided into a first sub-page buffer circuit 131 and a second sub-page buffer circuit 132 and may be disposed in the first regions R11 and R12, respectively. A block switch circuit 122 and a peripheral circuit 140 may be disposed in the second region R2 of the second wafer WF2.

Figure 15:
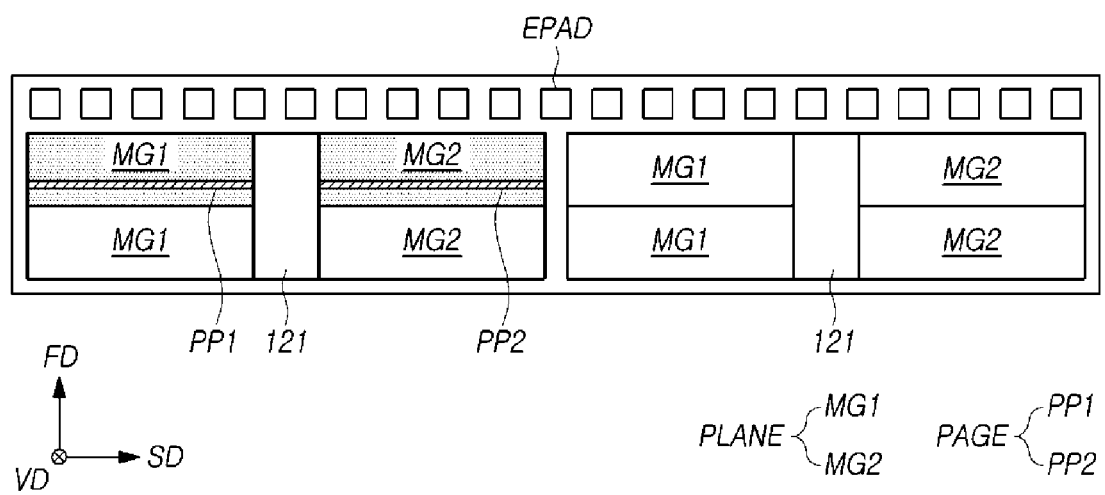
FIGS. 15 to 17 are diagrams that illustrate memory devices that are different from embodiments of the present disclosure.
Figure 16:
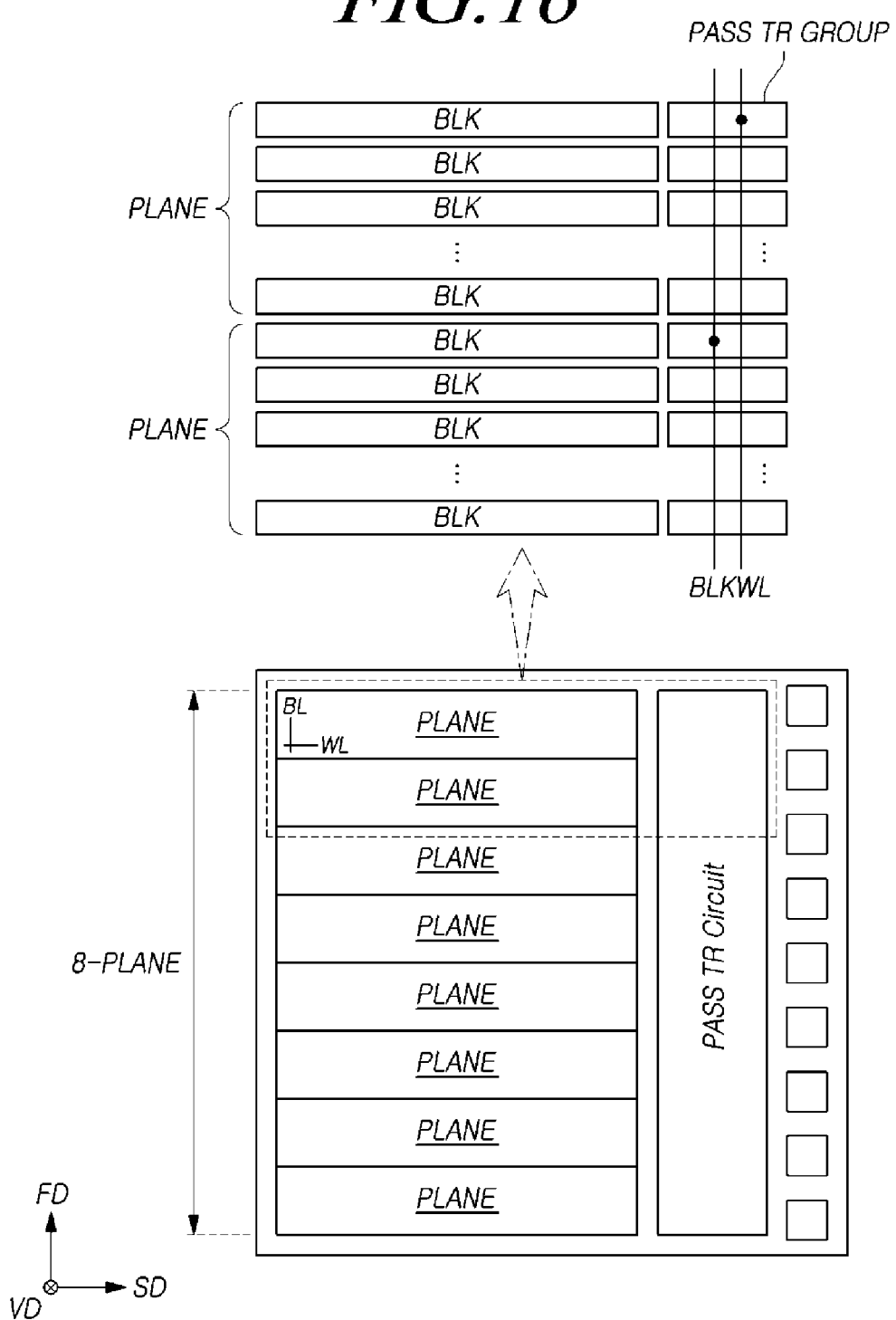
Figure 17:
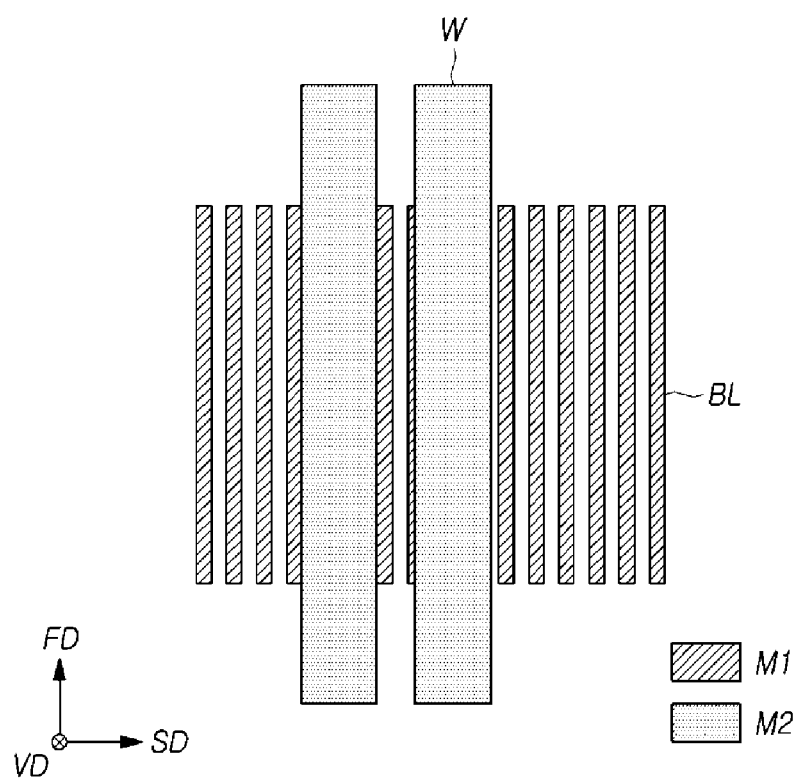

FIGS. 15 to 17 are diagrams that illustrate memory devices that are different from embodiments of the present disclosure.

Referring to FIG. 15, four planes PLANE are disposed in a 2×2 matrix form in the first direction FD and the second direction SD, and a first memory group MG1 and a second memory group MG2 included in each plane PLANE are disposed on both sides, respectively, of a pass transistor circuit 121 in the second direction SD. In this case, two pages PAGE may be disposed in a line in the second direction SD.

As a word line stack number is increased to improve the degree of integration, the number of pass transistors that transfer an operating voltage to word lines increases, and thus, the size of the pass transistor circuit 121 in the second direction SD and the size of the memory device in the second direction SD increase. If the word line stack number is increased, then the number of memory blocks required to realize the same capacity may decrease, and thus, the size of the memory device in the first direction FD may be reduced. For these reasons, the imbalance between the size of the memory device in the first direction FD and the size of the memory device in the second direction SD also increases.

As is well known, a net die is maximized when a memory device (a chip) has a square shape, and decreases as the imbalance between the size of the memory device in the first direction FD and the size of the memory device in the second direction SD increases. Accordingly, in order to increase the net die, it is necessary to reduce the size imbalance of the memory device and to bring the ratio of the size in the first direction FD and the size in the second direction closer to 1:1.

When planes PLANE are disposed as illustrated in FIG. 15, the size of the memory device in the second direction SD becomes excessively large compared to the size of the memory device in the first direction FD, resulting in serious size imbalance.

As a way to reduce the size imbalance, external coupling pads EPAD are disposed in a region adjacent to the planes PLANE in the first direction FD and arranged in the second direction SD so that the size of the memory device in the second direction SD is not increased due to the presence of the external coupling pads EPAD. However, the size imbalance is still serious.

When the external coupling pads EPAD are configured to be arranged in the second direction SD, as illustrated in FIG. 17, metal lines W must be configured to extend in the first direction FD, which intersects with the second direction SD. The second direction SD is the arrangement direction of the external coupling pads EPAD, so the metal lines W are disposed parallel to bit lines BL. As a result, an area over which a bit line BL overlaps with a metal line W may be different for each bit line BL.

Coupling capacitance is generated in an overlapping portion between the bit line BL and the metal line W, and the bit line BL has a coupling capacitance value proportional to an overlapping area with the metal line W.

As described above, since an area over which the bit line BL overlaps with the metal line W is different for each bit line BL, a deviation in coupling capacitance value occurs between the bit lines BL, and accordingly, a change in the distribution of memory cells coupled to the bit lines BL increases, thereby deteriorating the reliability of the memory device. For this reason, in a second wiring layer M2, an area overlapping with the bit line BL cannot be utilized for the arrangement of the metal line W.

As illustrated in FIG. 16, by disposing planes PLANE in a line in the first direction FD and reducing the size of each plane PLANE in the second direction SD by reducing a page size and increasing the number of planes PLANE, the problem caused due to the size imbalance described above may be solved without a change in capacity. However, if the number of planes PLANE is increased, then the number of memory blocks BLK also increases, and a larger block switch circuit is required. As a consequence, the size of a memory device increases, and a wiring structure becomes complicated.

Referring back to FIG. 2, according to embodiments of the present disclosure, by dividing the plane PLANE into the plurality of memory groups MG1 and MG2 including the plurality of partial pages PP1 and PP2, respectively, and disposing the plurality of memory groups MG1 and MG2 in a plurality of rows in the first direction FD, it is possible to reduce the imbalance between the size of the memory device in the first direction FD and the size of the memory device in the second direction SD, without increasing the number of planes PLANE. Therefore, it is possible to increase a net die without causing the problems related to a larger block switch circuit and a complicated wiring structure.

Further, the problems from the size imbalance of a memory device are solved and thus it is possible to arrange the external coupling pads EPAD in the first direction FD. As a result, the metal lines W may be configured to intersect with the bit lines BL, as described above with reference to FIG. 6. Accordingly, differences in areas over which each bit line BL overlaps with the metal lines W decreases, and deviations in coupling capacitance between the bit lines BL may be reduced. The distribution of memory cells may be decreased. Also, areas of the second wiring layer M2 overlapping with the bit lines BL may be utilized for the disposition of the metal lines W.

Figure 18:
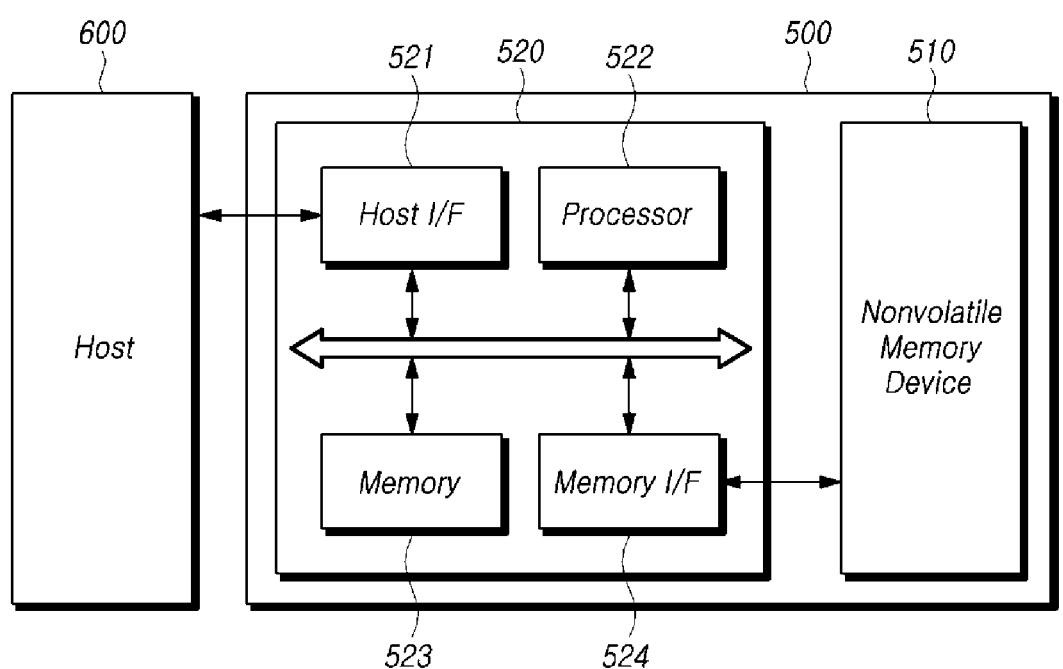
FIG. 18 is a block diagram schematically illustrating a memory system including a memory device in accordance with an embodiment of the present disclosure.

FIG. 18 is a block diagram schematically illustrating a memory system including a memory device in accordance with an embodiment of the present disclosure.

Referring to FIG. 18, a memory system 500 may store data to be accessed by a host 600 such as a mobile phone, an MP3 player, a laptop computer, a desktop computer, a game player, a TV, an in-vehicle infotainment system, and so forth.

The memory system 500 may be manufactured as any one of various kinds of storage devices according to the protocol of an interface, which is electrically coupled to the host 600. For example, the memory system 500 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 500 may be manufactured as any one among various kinds of package types. For example, the memory system 500 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 500 may include a nonvolatile memory device 510 and a controller 520.

The nonvolatile memory device 510 may operate as a storage medium of the memory system 500. The nonvolatile memory device 510 may be configured by any one of various types of nonvolatile memory devices, depending on the type of memory cells, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound.

While FIG. 18 illustrates that the memory system 500 includes one nonvolatile memory device 510, this is only for the sake of convenience in explanation, and the memory system 500 may include a plurality of nonvolatile memory devices. The present disclosure may be applied the same to the memory system 500 including a plurality of nonvolatile memory devices. The nonvolatile memory device 510 may include the memory device according to embodiments of the present disclosure.

The controller 520 may control general operations of the memory system 500 through driving of firmware or software loaded in a memory 523. The controller 520 may decode and drive a code type instruction or algorithm such as firmware or software. The controller 520 may be implemented in the form of hardware or in a combined form of hardware and software.

The controller 520 may include a host interface (Host I/F) 521, a processor 522, the memory 523 and a memory interface (Memory I/F) 524. Although not illustrated in FIG. 18, the controller 520 may further include an ECC (error correction code) engine, which generates a parity by ECC-encoding write data provided from the host 600 and ECC-decodes read data, read from the nonvolatile memory device 510, by using the parity.

The host interface 521 may interface the host 600 and the memory system 500 in correspondence to the protocol of the host 600. For example, the host interface 521 may communicate with the host 600 through any one of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 522 may be configured by a micro control unit (MCU) or a central processing unit (CPU). The processor 522 may process a request transmitted from the host 600. In order to process a request transmitted from the host 600, the processor 522 may drive a code type instruction or algorithm, that is, firmware, loaded in the memory 523, and may control the internal function blocks such as the host interface 521, the memory 523 and the memory interface 524 and the nonvolatile memory device 510.

The processor 522 may generate control signals for controlling the operation of the nonvolatile memory device 510, on the basis of requests transmitted from the host 600, and may provide the generated control signals to the nonvolatile memory device 510 through the memory interface 524.

The memory 523 may be configured by a random access memory such as a dynamic random access memory (DRAM) or a static random access memory (SRAM). The memory 523 may store firmware to be driven by the processor 522. Also, the memory 523 may store data necessary for driving the firmware, for example, metadata. Namely, the memory 523 may operate as a working memory of the processor 522.

The memory 523 may be configured to include a data buffer for temporarily storing write data to be transmitted from the host 600 to the nonvolatile memory device 510 or read data to be transmitted from the nonvolatile memory device 510 to the host 600. In other words, the memory 523 may operate as a buffer memory. The memory 523 may receive and store map data from the nonvolatile memory device 510 when the memory system 500 is booted.

The memory interface 524 may control the nonvolatile memory device 510 under the control of the processor 522. The memory interface 524 may also be referred to as a memory controller. The memory interface 524 may provide control signals to the nonvolatile memory device 510. The control signals may include a command, an address, an operation control signal and so forth for controlling the nonvolatile memory device 510. The memory interface 524 may provide data, stored in the data buffer, to the nonvolatile memory device 510, or may store data, transmitted from the nonvolatile memory device 510, in the data buffer.

The controller 520 may further include a map cache (not illustrated) which caches map data referred to by the processor 522 among map data stored in the memory 523.

Figure 19:
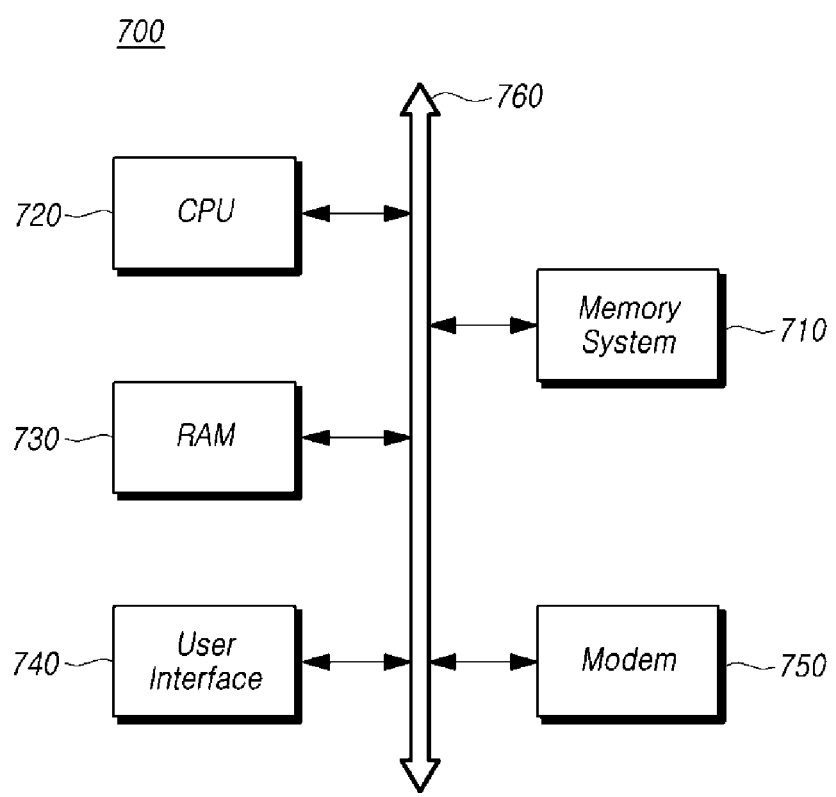
FIG. 19 is a block diagram schematically illustrating a computing system including a memory system in accordance with embodiments of the present disclosure.

FIG. 19 is a block diagram schematically illustrating a computing system including a memory device in accordance with embodiments of the disclosure.

Referring to FIG. 19, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory device comprising:
   a first wafer including a logic structure disposed on a top surface of the first wafer and a cell structure disposed on the bottom surface of the first wafer, wherein a cell region is disposed in the cell structure and a pass transistor circuit is disposed in the logic structure, a second wafer including a page buffer circuit, a peripheral circuit and a block switch circuit, and
a plurality of bit lines extending in a first direction and arranged in a second direction,
wherein the cell region includes a plane and is coupled to the plurality of bit lines,
wherein the plane is divided into a plurality of memory groups, each including a plurality of partial pages, that are disposed in a plurality of rows arranged in the first direction.

2. The memory device according to claim 1, wherein when viewed from a top, the plurality of partial pages included in each of the plurality of memory groups are arranged in the first direction.

3. The memory device according to claim 1, wherein a width of the cell region in the second direction is smaller than a sum of widths, in the second direction, of each of the plurality of memory groups included in the plane.

4. The memory device according to claim 1, wherein a width of the cell region in the second direction has the same size as a width of a memory group in the second direction.

5. The memory device according to claim 1,
wherein the pass transistor circuit is configured to provide an operating voltage to the plane,
wherein when viewed from a top, the cell region is divided into a plurality of sub-cell regions disposed on both sides of the pass transistor circuit in the second direction, and
wherein a width of each sub-cell region in the second direction has the same size as a width of a memory group in the second direction.

6. The memory device according to claim 1, further comprising:
a plurality of external coupling pads,
wherein when viewed from a top, the plurality of external coupling pads are arranged in the first direction adjacent to the cell region.

7. The memory device according to claim 1, further comprising:
a metal line that is disposed in a second wiring layer and that overlaps, in a vertical direction, with a first wiring layer in which the plurality of bit lines are disposed,
wherein the metal line and the plurality of bit lines intersect with each other from a top view.

8. The memory device according to claim 1, further comprising:
a metal line that is disposed in a second wiring layer and that overlaps, in a vertical direction, with a first wiring layer in which the plurality of bit lines are disposed,
wherein the metal line extends in the second direction.

9. A memory device comprising:
a first wafer including a logic structure disposed on one surface of the first wafer and a cell structure disposed on the other surface of the first wafer, wherein the cell structure includes a cell region and the logic structure includes a pass transistor circuit,
a second wafer including a page buffer circuit, a peripheral circuit and a block switch circuit, and
a plurality of bit lines extending in a first direction and arranged in a second direction,
wherein the cell region includes a plurality of memory blocks that are coupled to the plurality of bit lines,
wherein each memory block is divided into a plurality of sub-blocks each including a plurality of partial pages that are disposed in a plurality of rows arranged in the first direction.

10. The memory device according to claim 9, wherein a width of the cell region in the second direction is smaller than a sum of widths, in the second direction, of the plurality of sub-blocks included in a memory block.

11. The memory device according to claim 9, wherein a width of the cell region in the second direction has the same size as a width of a sub-block in the second direction.

12. The memory device according to claim 9,
wherein the pass transistor circuit is configured to provide an operating voltage to the cell region,
wherein when viewed from a top, the cell region is divided into a plurality of sub-cell regions disposed on both sides of the pass transistor circuit in the second direction, and
wherein a width of each sub-cell region in the second direction has the same size as a width of each sub-block in the second direction.

13. The memory device according to claim 9
wherein the pass transistor circuit includes a plurality of pass transistor groups, each of which transfers an operating voltage to a corresponding sub-block in response to a block selection signal provided through a block word line,
wherein pass transistor groups that transfer an operating voltage to sub-blocks included in a single memory block share a block word line.

14. A memory device comprising:
a first wafer including a logic structure and a cell structure disposed under the logic structure,
a cell region disposed in the cell structure, and including a plurality of memory blocks, which are coupled to a plurality of bit lines that extend in a first direction and that are arranged in a second direction;
a pass transistor circuit, disposed in the logic structure, that is configured to transfer an operating voltage to the plurality of memory blocks in response to a block selection signal; and
a block switch circuit included in a second wafer, which overlaps with the first wafer in a vertical direction, that is configured to provide the block selection signal to the pass transistor circuit,
wherein each memory block is divided into a plurality of sub-blocks each including a plurality of partial pages that are disposed in a plurality of rows arranged in the first direction.

15. The memory device according to claim 14, wherein a width of the cell region in the second direction is smaller than a sum of widths, in the second direction, of the plurality of sub-blocks included in each memory block.

16. The memory device according to claim 14, further comprising:
a plurality of pass transistor groups each configured to transfer an operating voltage to a corresponding sub-block in response to the block selection signal provided through a block word line,
wherein pass transistor groups that transfer an operating voltage to sub-blocks included in a single memory block share a block word line.

17. The memory device according to claim 14, wherein
the first wafer further includes a plurality of external coupling pads that are arranged in the first direction adjacent to the cell region, and
the external coupling pads are disposed such that at least portions thereof overlap with the pass transistor circuit in the vertical direction.

18. The memory device according to claim 14, wherein the first wafer further includes a metal line that is disposed in a second wiring layer overlapping, in the vertical direction, with a first wiring layer where the plurality of bit lines are disposed, and the metal line and the plurality of bit lines intersect with each other.

19. The memory device according to claim 18, wherein the second wiring layer is disposed on one surface of the first wafer that is bonded to the second wafer.

\* \* \* \* \*